United States Patent
Konishi et al.

(10) Patent No.: US 7,302,021 B2
(45) Date of Patent: Nov. 27, 2007

(54) DIGITAL BROADCAST RECEIVING APPARATUS

(75) Inventors: Takaaki Konishi, Ibaraki (JP); Hiroshi Azakami, Ibaraki (JP); Kazuya Ueda, Hirakata (JP); Naoya Tokunaga, Moriguchi (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 701 days.

(21) Appl. No.: 09/878,427

(22) Filed: Jun. 12, 2001

(65) Prior Publication Data

US 2002/0021371 A1     Feb. 21, 2002

(30) Foreign Application Priority Data

Jun. 13, 2000   (JP)   ............................. 2000-176411

(51) Int. Cl.
*H04L 27/08* (2006.01)
(52) U.S. Cl. ............... 375/345; 375/219; 375/260; 375/340; 375/233; 348/678; 348/455; 348/555; 348/685; 330/254; 330/279; 330/280
(58) Field of Classification Search .............. 375/345, 375/219, 260, 340, 233, 324; 348/555, 678, 348/378, 455, 685; 330/280, 254, 279; 329/304; 455/246.1, 252.1
See application file for complete search history.

(56) References Cited

U.S. PATENT DOCUMENTS

| | | | | |
|---|---|---|---|---|
| 5,515,004 A | * | 5/1996 | Alford et al. ............... | 330/254 |
| 5,950,112 A | * | 9/1999 | Hori et al. .................. | 725/148 |
| 6,049,361 A | * | 4/2000 | Kim .......................... | 348/678 |
| 6,121,828 A | * | 9/2000 | Sasaki ........................ | 329/304 |
| 6,310,513 B1 | * | 10/2001 | Iemura ....................... | 329/304 |
| 6,369,857 B1 | * | 4/2002 | Balaban et al. ............. | 348/555 |
| 6,421,098 B1 | * | 7/2002 | Oya ............................ | 348/678 |
| 6,545,532 B1 | * | 4/2003 | Maalej et al. ............... | 329/304 |

FOREIGN PATENT DOCUMENTS

| | | |
|---|---|---|
| EP | 0 903 937 | 3/1999 |
| GB | 2 342 238 | 4/2000 |
| JP | 09-252441 | 9/1997 |

* cited by examiner

*Primary Examiner*—Chieh M. Fan
*Assistant Examiner*—Eva Zheng
(74) *Attorney, Agent, or Firm*—Wenderoth, Lind & Ponack, L.L.P.

(57) ABSTRACT

In a digital broadcast receiving apparatus for amplifying a received modulated digital signal wave with automatically adjusted gain and demodulating the modulated signal wave to a digital signal, a tuner frequency-converts the modulated digital signal wave to generate a first modulated signal. A first automatic gain control amplification unit controls gain of the tuner to make a level of the first modulated signal at a first predetermined level. An A/D converter converts the first modulated signal into a second modulated signal. A demodulator demodulates the second modulated signal to generate a first demodulated digital signal. A second automatic gain control amplifier generates a second demodulated digital signal where frequency fluctuations included in the digital modulated wave are eliminated.

12 Claims, 24 Drawing Sheets

To Error Correction Processing

DIGITAL BROADCAST RECEIVING APPARATUS

BACKGROUND OF THE INVENTION

1. Field of the Invention

The present invention relates to apparatuses for receiving television and radio broadcasting, especially digital broadcasting.

2. Description of the Background Art

Shown in FIG. 21 is the structure of a conventional digital broadcast receiving apparatus. A digital broadcast receiving apparatus Rc includes an antenna 1, a tuner 2, an A/D converter 3, a demodulator 7, and an automatic gain controller AGC. The automatic gain controller AGC includes an automatic gain control signal generator (hereinafter referred to as AGC signal generator) SG, and a level detector LD. A digital broadcast wave RF transmitted from a broadcasting station is propagated through the air and received by the antenna 1. The received digital broadcast wave Srf is frequency-converted by the tuner 2 into a modulated analog signal SMA. This modulated analog signal SMA is converted by the A/D converter 3 into a modulated digital signal SMD, and then outputted to the automatic gain controller AGC and the demodulator 7.

In the automatic gain controller AGC, the level detector LD detects the level of the received modulated digital signal SMD, and determines whether the detected signal level is higher than a predetermined level (reference value) or not for generating a level signal SL. The AGC signal generator SG generates, based on the level signal SL supplied by the level detector LD, a control signal SAG for adjusting the gain of the tuner 2, and outputs the control signal SAG to the tuner 2. In other words, if the signal level is larger than the predetermined level (reference value), the level detector LD causes the AGC signal generator SG to output the control signal SAG for decreasing the gain of the tuner 2. On the other hand, if the signal level is equal to or lower than the predetermined level (reference value), the level detector LD causes the AGC signal generator SG to output the control signal SAG for increasing the gain of the tuner 2.

After the gain of the tuner 2 is controlled, the modulated analog signal SMA is converted by the A/D converter 3 into the modulated digital signal SMD. Then, from this modulated digital signal SMD, a demodulated digital signal SDD is generated by the demodulator 7 for output to the following error correction processing.

Shown in FIG. 22 is the structure of the level detector LD in detail. The level detector LD includes a subtractor 12, an adder 13, a delay unit 14, and a bit shifter 15 (represented as "$2^{-n}$" in FIG. 22). Note that n represents the number of shift bits. The adder 13 and the delay unit 14 form an integrator 100. For example, if an average value is obtained from $4096=2^{12}$ values of data, the bit shifter 15 is set as n=12. An averaged signal $Y/2^n$ received from the bit shifter 15 is subtracted by the subtractor 12 from the modulated digital signal SMD supplied by the A/D converter 3, and the result is outputted to the integrator 100.

Shown in FIG. 23 is the structure of the AGC signal generator SG in detail. The AGC signal generator SG includes a reference value provider 16, a subtractor 24, a multiplier 17, a constant provider 18, an integrator 21, a level converter LC, a PWM (Pulse Width Modulator) 22, and a low-pass filter 23. The integrator 21 includes an adder 19 and a delay unit 20. The level converter LC includes a multiplier 33, an inverse coefficient provider 34, a compensation coefficient provider 46, and an adder 47.

The subtractor 24 finds an error between the level signal SL supplied by the level detector LD and a predetermined reference value R supplied by the reference value provider 16 to generate an error signal SE. Note that, for the purpose of simplifying the description, signals and parameters may hereinafter be simply represented by reference characters as appropriate. The multiplier 17 multiplies the error signal SE received from the subtractor 24 by a constant G received from the constant provider 18 to generate G·SE for output to the integrator 21.

In the integrator 21, the delay unit 20 first delays G·SE outputted from the multiplier 17 by a control cycle t, and then the adder 19 adds the delayed signal to a current output from the multiplier 17 for integration of G·SE. The integration result is outputted as an integrated signal Z from the delay unit 20 to the adder 19 and the level converter LC. Note herein that one control cycle is a sequence of control processing successively carried out in the digital broadcast receiving apparatus Rc and a digital broadcast receiving apparatus RPa according to the present invention, and their components. Also note that one control cycle period is a time period required for execution of one control cycle, that is, a period from start of one control cycle until before start of the next control cycle.

In the level converter LC, the multiplier 33 multiplies the integrated signal Z outputted from the integrator 21 by "−1" outputted from the inverse coefficient provider 34 to invert the polarity of the integrated signal Z, and generates −Z. The adder 47 adds a compensation coefficient OB provided by the compensation coefficient provider 46 to −Z provided by the multiplier 33, and generates −Z+OB. The PWM 22 modulates the pulse width of −Z+OB received from the adder 47 to generate a square-wave signal Sr. The low-pass filter 23 extracts low-frequency components from the square-wave signal Sr supplied by the PWM 22 to generate the control signal SAG having a predetermined control voltage. Consequently, the tuner 2, the level detector LD, and the AGC signal generator SG form a loop.

The level converter LC is briefly described below. The level converter LC is provided to normalize the value of the integrated signal Z outputted from the integrator 21 before processed by the PWM 22 for correct gain control if the value of integrated signal Z is larger than the reference value. Therefore, the inverse coefficient provider 34 provides the inverse coefficient, that is, a predetermined negative value, to the multiplier 33 for inverting the polarity of the integrated signal Z. The compensation coefficient provider 46 provides, for the sake of convenience of the processing in the PWM 22, the compensation coefficient OB having a predetermined value for compensating the inverted integrated signal Z (−Z) so that it takes a positive value or 0 at the output from the level converter LC.

The value of the compensation coefficient OB is determined based on the inverse coefficient provided by the inverse coefficient provider 34 and the number of output bits of the integrator 21. Now, consider the case where the inverse coefficient is −1, and the number of output bits of the integrator 21 is 11. In this case, the integrated signal Z takes a value in the range of −1024 to +1023. If the compensation coefficient OB is set to 11 bits (1024), which is the number of output bits of the integrator 21, the value of −Z+OB outputted from the adder 47 falls within the range of 0 to +2047. −Z+OB takes a value of +1024 (OB) if the output from the integrator 21 is 0, while taking a value in the range of +1025 to +2047 if negative. As such, correct gain control can be achieved according to fluctuations of the digital broadcast wave Srf.

FIGS. 22 and 23 schematically illustrate processes on various signals generated in the level detector LD and the AGC signal generator SG in an arbitrary control cycle t. Throughout this specification, the control cycle is represented as t. That is, a control cycle previous to the control cycle t is represented as t with a natural number added thereto, and the one next thereto as t with a natural number subtracted therefrom. As such, the control cycle t is also a parameter indicating a relative time. Furthermore, for the sake of convenience, the control cycle t may be simply referred to as "t", and also each signal and parameter may be referred to as its reference character.

As shown in FIG. 22, the subtractor 12 of the level detector LD subtracts the averaged signal $Y(t+1)/2^n$ supplied by the bit shifter 15 from SMD(t) supplied by the A/D converter 3 to generate $SMD(t)-Y(t+1)/2^n$.

The adder 13 of the integrator 100 adds $SMD(t)-Y(t+1)/2^n$ supplied by the subtractor 12 to the integrated signal $Y(t+1)$ supplied by the delay unit 14 to generate $SMD(t)-Y(t+1)/2^n+Y(t+1)=SMD(t)+Y(t+1)(1-2^{-n})$.

The delay unit 14 delays $SMD(t)+Y(t+1)(1-2^{-n})$ outputted from the adder 13 by one control cycle t to generate an integrated signal $Y(t+1)$.

The bit shifter 15 shifts the integrated signal $Y(t+1)$ by the predetermined number of shift bits n to generate an averaged signal $Y(t+1)/2^n$. This averaged signal $Y(t+1)/2^n$ is equivalent to the average of $2^n$ data values of the modulated digital signal SMD supplied to the level detector LD. In this sense, the number of shift bits n defines the number of data values required for finding the average value by the bit shifter 15. In other words, $2^n$ is the number of data values required for finding the average value of the modulated digital signal SMD supplied to the level detector LD, and the number of shift bits n is an averaging coefficient. Hereinafter, $2^n$ is referred to as the number of data values for averaging.

Next, as shown in FIG. 23, the subtractor 24 of the AGC signal generator SG subtracts the reference value R provided by the reference value provider 16 from the level signal SL supplied by the level detector LD to generate the error signal SE(t).

The multiplier 17 multiplies SE(t) supplied by the subtractor 24 by the constant G provided by the constant provider 18 to generate G·SE(t).

The adder 19 of the integrator 21 adds G·SE(t) supplied by the multiplier 17 to the integrated signal $Z(t+1)$ outputted from the delay unit 20 to generate $G·SE(t)+Z(t+1)$.

The delay unit 20 delays $G·SE(t)+Z(t+1)$ supplied by the adder 19 by one control cycle t to generate the integrated signal $Z(t+1)$.

The inverse coefficient provider 34 of the level converter LC multiplies the integrated signal $Z(t+1)$ received from the delay unit 20 by the inverse coefficient "−1" provided by the inverse coefficient provider 34 to generate $-Z(t+1)$.

The adder 47 adds $-Z(t+1)$ supplied by the multiplier 33 to the compensation coefficient OB provided by the compensation coefficient provider 46 to generate $-Z(t+1)+OB$.

The PWM 22 converts the pulse width of $-Z(t+1)+OB$ supplied by the level converter LC to generate a square-wave signal Sr. The low-pass filter 23 extracts low-frequency components from the square-wave signal Sr supplied by the PWM 22 to generate the gain control signal SAG at a desired stable level.

In the above structured digital broadcast receiving apparatus Rc, if the signal of the digital broadcast wave Srf becomes maximum and accordingly the level signal SL becomes maximum, $-Z+OB$ becomes 0 and the square-wave signal Sr becomes constant at 0, as shown in FIG. 24.

The control signal SAG therefore becomes minimum. If the digital broadcast wave Srf becomes intermediate and accordingly the level signal SL becomes intermediate, $-Z+OB$ becomes 1024 and the square-wave signal Sr alternately indicates 0 and 1, as shown in FIG. 25. The control signal SAG therefore becomes intermediate. If the digital broadcast wave Srf becomes minimum and accordingly the level signal SL becomes minimum, $-Z+OB$ becomes +2047 and the square-wave signal Sr becomes constant at 1, as shown in FIG. 26. The control signal SAG therefore becomes maximum.

Exemplarily shown in FIG. 27 is a relation between the digital broadcast wave Srf and the modulated analog signal SMA in the above structured digital broadcast receiving apparatus Rc. In FIG. 27, SW1 in the upper part represents a signal waveform of the digital broadcast wave Srf in a relatively short period of time. SW2 in the middle part represents an envelope waveform of the digital broadcast waveform Srf in a period considerably longer than that shown by SW1. In this example, the digital broadcast wave Srf fluctuates in amplitude within 6 dB and in frequency within 100 Hz. SW3 in the lower part represents a signal waveform of the modulated analog signal SMA outputted from the tuner 2 after fluctuations are eliminated from the digital broadcast wave Srf (SW2). With a smaller number of data values used for level detection by the level detector LD (for example, $127, 2^7$) and a larger value of the constant G used for multiplication by the multiplier 17 of the AGC signal generator SG (for example, 128), the modulated analog signal SMA outputted from the tuner 2 can be made not to fluctuate in frequency. That is, the digital broadcast receiving apparatus Rc can follow the frequency fluctuations of the received digital broadcast wave Srf.

In the above digital broadcast receiving apparatus Rc, it has been confirmed through experiments that a maximum followable fluctuation frequency of the digital broadcast wave Srf whose amplitude fluctuates within 6 dB is approximately 100 Hz. Specifically, with the smallest possible number of data values (the number of shift bits n) used for level detection in the level detector LD and the largest possible constant G, the above apparatus can generate the modulated analog signal SMA without frequency fluctuations from the digital broadcast wave Srf whose amplitude fluctuates within 6 dB and whose frequency fluctuates up to 100 Hz. Such frequency fluctuations of 100 Hz are caused by an object moving at 180 km per hour toward the digital broadcast wave Srf emitted from a broadcast station or a relay station and propagated through the air to reach the digital broadcast receiving apparatus Rc.

However, the digital broadcast wave Srf whose frequency fluctuates within the maximum followable fluctuation frequency (100 Hz) may often fluctuate thereover due to swaying leaves, collision with a moving object such as a vehicle, or reflection from a fast-moving object such as an airplane. In such case, the digital broadcast receiving apparatus Rc cannot follow the frequency fluctuations of the digital broadcast wave Srf, and therefore cannot reproduce the demodulated digital signal SDD with high quality.

Moreover, the ratio of control voltage to gain in the tuner 2 is varied depending on the level of the digital broadcast wave Srf supplied thereto. Therefore, the capability of following frequency fluctuations is also varied depending thereon, and so is the quality of the demodulated digital signal SDD accordingly.

As stated above, in conventional analog broadcast typified by NTSC, a received broadcast wave reflected upon a fast-moving object, such as an airplane, causes deterioration in quality of a demodulated signal. Such deterioration further causes image disturbance, but does not interrupt images. In digital broadcast, however, the demodulated digital signal SDD deteriorated in quality causes a complete interrupt of a video stream.

SUMMARY OF THE INVENTION

Therefore, an object of the present invention is to provide a digital broadcast receiving apparatus capable of reproducing an uninterrupted video stream by following even large frequency fluctuations in a digital broadcast wave caused by a fast-moving object such as an airplane.

The present invention has the following features to attain the object above.

A first aspect of the present invention is directed to a digital broadcast receiving apparatus for amplifying a digital modulated signal wave propagated through air with gain automatically adjusted to have a predetermined amplitude, and demodulating the modulated signal wave to a digital signal, the apparatus comprising:

a tuner unit for frequency-converting the received digital modulated signal wave into a first modulated signal;

a first automatic gain control amplification unit for controlling gain of the tuner unit to make a level of the first modulated signal at a first predetermined level;

an A/D conversion unit for converting, analog to digital, the first modulated signal into a second modulated signal;

a demodulation unit for demodulating the second modulated signal into a first demodulated digital signal; and a second automatic gain control amplification unit for amplifying a level of the first demodulated digital signal to be at a second predetermined level, and generating a second demodulated digital signal.

As described above, in the first aspect, two automatic gain controllers are provided: a first automatic gain controller forming a gain loop with a tuner and requiring some time for level detection through gain control of the tuner, and a second automatic gain controller not requiring much time therefor. Thus, gain control requiring high speed and gain control not requiring high speed are serially carried out in a distributed manner by the first and second automatic gain controllers.

According to a second aspect, in the first aspect, the first automatic gain control amplification unit amplifies the digital modulated signal wave without following frequency fluctuations thereof, and generates the first modulated signal, and the second automatic gain control amplification unit amplifies the first demodulated digital signal by following frequency fluctuations thereof, and generates the second demodulated digital signal.

As described above, in the second aspect, the second automatic gain controller carries out gain control that follows frequency fluctuations. Thus, high-frequency fluctuations that have not been followed conventionally can be followed.

According to a third aspect, in the first aspect, the first automatic gain control amplification unit amplifies the digital modulated signal wave by following frequency fluctuations thereof that are smaller than a first predetermined frequency, and generates the first modulated signal, and the second automatic gain control amplification unit amplifies the first demodulated digital signal by following frequency fluctuations thereof under a second predetermined frequency that is larger than the first predetermined frequency, and generates the second demodulated digital signal.

As described above, in the third aspect, low-frequency fluctuations are followed by the first gain controller, and then high-frequency fluctuations are followed by the second automatic gain controller. Thus, influences of noise components included in the digital modulated signal wave can be reduced.

According to a fourth aspect, in the third aspect, the apparatus further comprises a level detection unit for detecting the level of the first modulated signal; and a gain change unit for changing the gain of the tuner unit based on the detected level.

As described above, in the fourth aspect, the gain can be appropriately set according to the characteristic of the tuner.

According to a fifth aspect, in the fourth aspect, the apparatus further comprises a threshold unit for taking, as a threshold, a threshold voltage at which a control-voltage to amplitude-attenuation characteristic of the tuner unit is abruptly changed, wherein the gain change unit takes, as the gain, a first predetermined value when the detected level is higher than the threshold, and a second predetermined value smaller than the first predetermined value when the detected level is lower than the threshold.

As described above, in the fifth aspect, the gain can be appropriately set with respect to the threshold voltage at which the characteristic of the tuner is abruptly and significantly changed.

According to a sixth aspect, in the fourth aspect, the apparatus further comprises a first threshold unit taking, as a first threshold, a voltage lower, by a first predetermined amount, than a threshold voltage at which a control-voltage to amplitude-attenuation characteristic of the tuner unit is abruptly changed; and a second threshold unit taking, as a second threshold, a voltage lower, by a second predetermined amount, than the threshold voltage, wherein the gain change unit takes, as the gain, a first predetermined value when the detected level is lower than the first threshold; a second predetermined value larger than the first predetermined value when the detected level is higher than the second threshold; and one of the first and second predetermined values based on a value immediately before the detected level when the detected level is higher than the first threshold and lower than the second threshold.

As described above, in the sixth aspect, a buffer region is provided for gain change within a region including the threshold voltage at which the characteristic of the tuner is abruptly changed. Thus, even if the detected level is abruptly fluctuated centering on the threshold voltage, jitter in gain value can be prevented.

A seventh aspect of the present invention is directed to a digital broadcast receiving apparatus for amplifying a digital modulated signal wave propagated through air with gain automatically adjusted to have a predetermined amplitude, and demodulating the modulated signal wave to a digital signal, the apparatus comprising:

a tuner unit for frequency-converting the received digital modulated signal wave into a first modulated signal;

a first automatic gain control amplification unit for controlling gain of the tuner unit to make a level of the first modulated signal at a first predetermined level;

an A/D conversion unit for converting, analog to digital, the first modulated signal into a second modulated signal; and a second automatic gain control amplification unit for amplifying a level of the second modulated signal to be at a second predetermined level, and generating a third modulated signal.

As described above, in the seventh aspect, the same effects as described in the first aspect can be achieved. Moreover, the second automatic gain controller is provided immediately after the first automatic gain controller, there by making the speed of gain control higher.

These and other objects, features, aspects and advantages of the present invention will become more apparent from the following detailed description of the present invention when taken in conjunction with the accompanying drawings.

DESCRIPTION OF THE PREFERRED EMBODIMENTS

With reference to FIGS. 1, 2, 3, 4, 5, and 6, described below first is a digital broadcast receiving apparatus according to a first embodiment of the present invention. Then, with reference to FIGS. 7, 8, 9, 10, 11, and 12, described is a digital broadcast receiving apparatus according to a second embodiment of the present invention. Then, with reference to FIGS. 13, 14, 15, and 16, described is a digital broadcast receiving apparatus according to a third embodiment of the present invention. Lastly, with reference to FIGS. 17, 18, 19, and 20, described is a digital broadcast receiving apparatus according to a fourth embodiment of the present invention.

First Embodiment

With reference to FIGS. 1 through 6, described below is the digital broadcast receiving apparatus according to the first embodiment of the present invention applied to receive a digital broadcast wave. Prior to that, the basic concept of the present invention is first described. An object of the present invention is to follow large frequency fluctuations over 100 Hz. However, as in the conventional digital broadcast receiving apparatus Rc where the automatic gain controller AGC, the tuner 2, and the A/D converter 3 form a gain control loop, delayed time occurring between the level detector LD and the tuner 2 is so long that such fluctuations over 100 Hz cannot be followed. To solve this problem, in the present invention, a multiplier, a second level detector, and a second automatic gain control signal generator (hereinafter referred to as second AGC signal generator) are newly provided after the demodulator 7 to configure another automatic gain controller and, accordingly, form a gain control loop. Among these components, delayed time is extremely short, and therefore frequency fluctuations of the digital broadcast wave Srf can be sufficiently followed.

In this respect, in the digital broadcast receiving apparatus RPa according to the first embodiment of the present invention, the frequency-fluctuating digital broadcast wave Srf passes, as it is, through a first automatic gain controller which corresponds to the automatic gain controller AGC in the conventional digital broadcast receiving apparatus Rc, and is outputted from the demodulator 7 as a demodulated first digital signal. Then, the demodulated first digital signal is supplied to the newly provided second automatic gain controller, where frequency fluctuations thereof are substantially eliminated. Note that, in the digital broadcast receiving apparatus RPa according to the present embodiment, when the frequency of the digital broadcast wave Srf is 600 MHz, frequency fluctuations in a range of approximately 600 Hz can be eliminated. These fluctuations correspond to those caused in the digital broadcast wave Srf by an object moving at 1080 km per hour.

Figure 1:
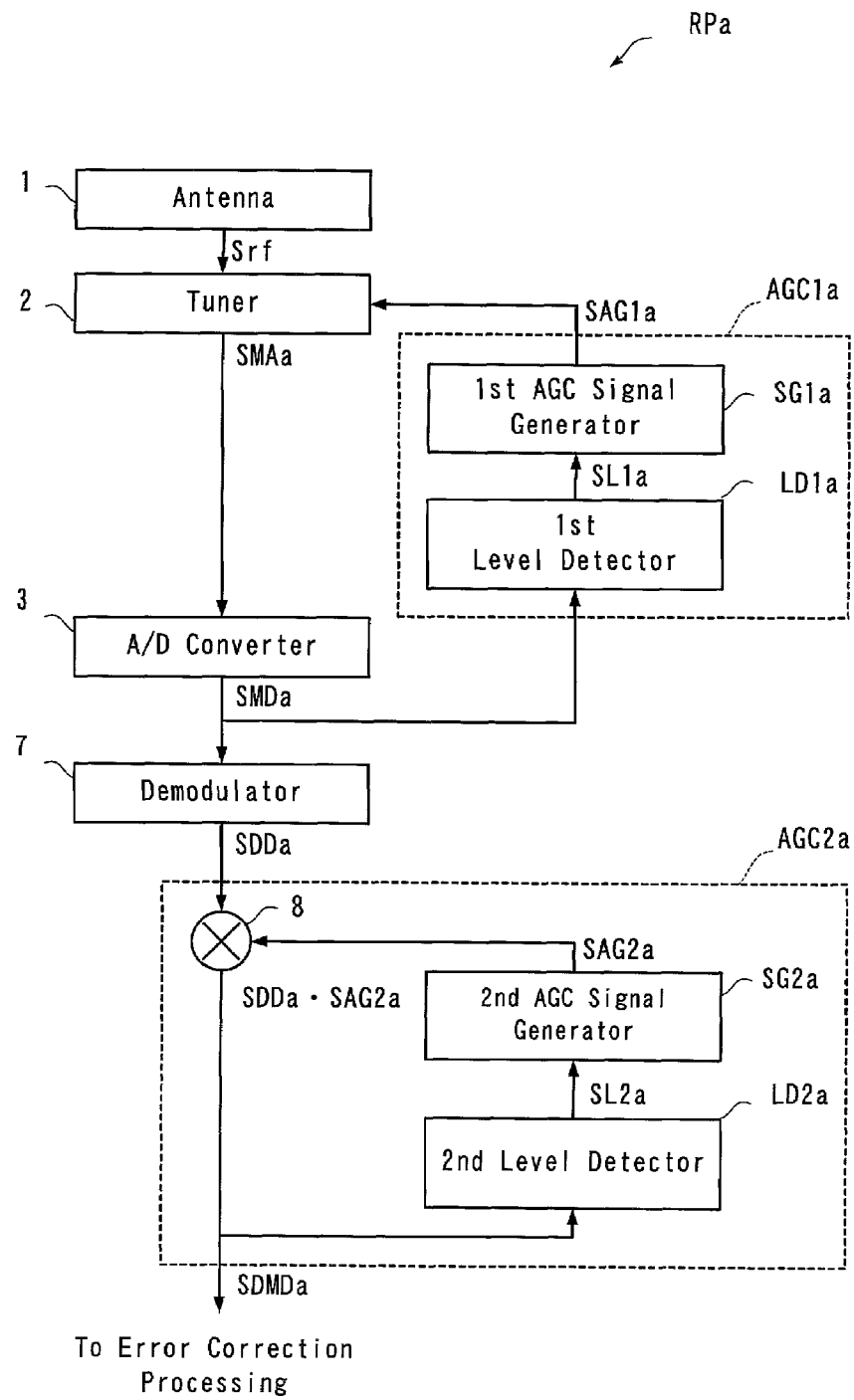
FIG. 1 is a block diagram showing the structure of a digital broadcast receiving apparatus according to a first embodiment of the present invention.

As shown in FIG. 1, the digital broadcast receiving apparatus RPa according to the present embodiment includes the antenna 1, the tuner 2, the A/D converter 3, a first automatic gain controller AGC1a, the demodulator 7, and a second automatic gain controller AGC2a. The digital broadcast wave RF transmitted from a broadcast station is propagated through the air, and received by the antenna 1. The digital broadcast wave Srf is frequency-converted by the tuner 2 into a modulated analog signal SMAa. The modulated analog signal SMAa is converted by the A/D converter 3 into a modulated digital signal SMDa. The modulated digital signal SMDa is supplied to the first automatic gain controller AGC1a and the demodulator 7.

The first automatic gain controller AGC1a corresponds to the automatic gain controller AGC described above concerning the basic concept of the present invention, and is provided for passing the digital broadcast wave Srf as it is, with gain controlled but without frequency fluctuations eliminated. The first automatic gain controller AGC1a includes a first automatic gain control signal generator (hereinafter, first AGC signal generator) SG1a and a first level detector LD1a.

The first level detector LD1a is connected to the A/D converter 3 for receiving the modulated digital signal SMDa. The first level detector LD1a detects an average level of the modulated digital signal SMDa, and generates a first level signal SL1a indicative of the detected average level.

The first AGC signal generator SG1a is connected to the first level detector LD1a for receiving the first level signal SL1a. The first AGC signal generator SG1a generates, based on the first level signal SL1a, a first gain control signal SAG1a for appropriately controlling the gain obtained when the tuner 2 generates the modulated analog signal SMAa from the digital broadcast wave Srf. The first AGC signal generator SG1a then outputs the first gain control signal SAG1a to the tuner 2. The structure of the first level detector LD1a and the first AGC signal generator SG1a will be described later with reference to FIGS. 2 and 3.

The tuner 2 adjusts the level of the digital broadcast wave Srf received from the antenna 2, based on the first gain control signal SAG1a supplied by the first AGC signal generator SG1a of the first automatic gain controller AGC1a. In other words, the modulated analog signal SMAa with its gain controlled is outputted from the tuner 2 to the A/D converter 3.

As such, the modulated analog signal SMAa is gain-controlled by the first automatic gain controller AGC1a, and then converted by the A/D converter 3 into the modulated digital signal SMDa. The modulated digital signal SMDa is supplied to the demodulator 7 and also again to the first automatic gain controller AGC1a. Then, the first automatic gain controller AGC1a repeats the above level control processing. On the other hand, the demodulator 7 demodulates the modulated digital signal SMDa into a demodulated first digital signal SDDa, and outputs it to a second automatic gain controller AGC2a. Note that, as described above, the digital modulated and demodulated signals SMDa and SDDa are generated without frequency fluctuations of the digital broadcast wave Srf being eliminated.

As with the first automatic gain controller AGC1a, the second automatic gain controller AGC2a includes a second level detector LD2a for generating a second level signal SL2a, a second automatic gain control signal generator (hereinafter, second AGC signal generator) SG2a for generating a second gain control signal SAG2a, and further a multiplier 8. The second automatic gain controller AGC2a subjects the demodulated first digital signal SDDa to gain control processing and frequency fluctuation eliminating processing, and then outputs the resultant signal as a second digital signal SDMDa to the following error correction processing unit (not shown).

The multiplier 8 multiples the demodulated first digital signal SDDa outputted from the demodulator 7 by the second gain control signal SAG2a outputted from the second AGC signal generator SG2a, and generates a signal SDDa·SAG2a with gain controlled and frequency fluctuations eliminated. Note that, as described above, each signal herein may be simply represented by a reference character as appropriate for simplification and readability. Then, the generated signal SDDa·SAG2a is fed back to the second level detector LD2a and also supplied to the following error correction processing unit as the demodulated second digital signal SDMDa.

The second level detector LD2a generates the second level signal SL2a based on the signal SDDa·SAG2a supplied by the multiplier 8, and outputs it to the second AGC signal generator SG2a. The second AGC signal generator SG2a generates the second gain control signal SAG2a based on the second level signal SL2a supplied by the second level detector LD2a. These will also be described later in detail with reference to FIG. 5.

Figure 2:
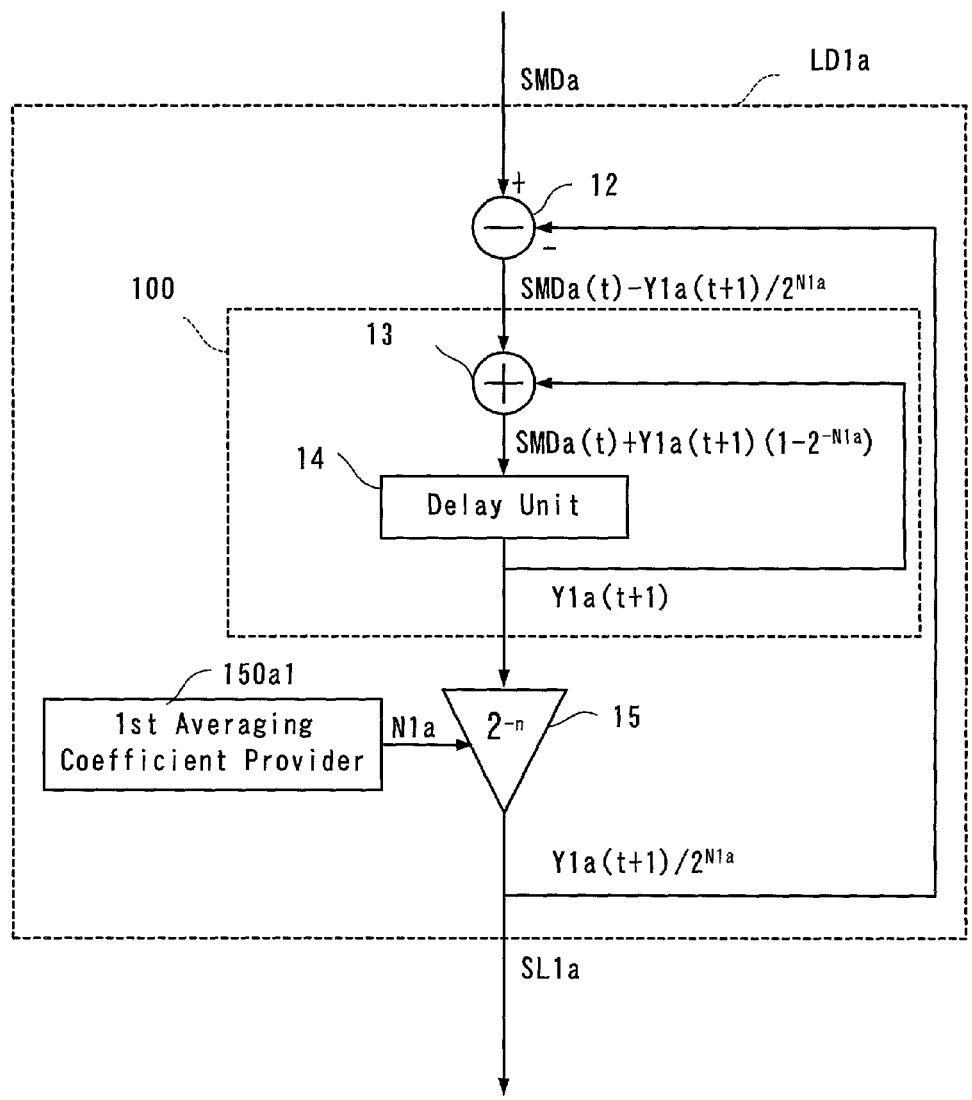
FIG. 2 is a block diagram showing the structure of a first level detector shown in FIG. 1.

With reference to FIG. 2, described next in detail is the above first level detector LD1a. The first level detector LD1a includes a subtractor 12, an integrator 100, a bit shifter 15, and a first averaging coefficient provider 150a1. The integrator 100 includes an adder 13 and a delay unit 14. From the modulated digital signal SMDa supplied to the first level detector LD1a, an averaged signal $Y1a/2^n$ outputted by the bit shifter 15 is subtracted by the subtractor 12. The resultant signal is supplied to the integrator 100.

The adder 13 of the integrator 100 adds an integrated signal Y1a supplied by the delay unit 14 to the signal supplied by the subtractor 12, and then outputs the resultant signal to the delay unit 14. The delay unit 14 delays the signal received from the adder 13 by one control cycle t, and then outputs the delayed signal as the integrated signal Y1a to the adder 13 and the bit shifter 15.

The bit shifter 15 shifts the integrated signal Y1a received from the delay unit 14 of the integrator 100 by the preset number of bits n, Then, the bit shifter 15 outputs the resultant signal as the averaged signal $Y1a/2n$ to the subtractor 12, and as the first level signal SL1a to the first AGC signal generator SG1a. The first averaging coefficient provider 150a1 outputs a first shift bit parameter (first averaging coefficient) N1a defining the number of shift bits n for the bit shifter 15.

Schematically shown in FIG. 2 is the processing of various signals generated in the first level detector LD1a in an arbitrary control cycle t. In the subtractor 12, the averaged signal $Y1a(t+1)/2^{N1a}$ supplied by the bit shifter 15 is subtracted from the SMDa(t) supplied by the A/D converter 3, and $SMDa(t)-Y1a(t+1)/2^{N1a}$ is generated.

In the integrator 100, the adder 13 adds the signal $SMDa(t)-Y1a(t+1)/2^{N1a}$ supplied by the subtractor 12 to the integrated signal Y1a(t+1) supplied by the delay unit 14 to generate a signal $SMDa(t)-Y1a(t+1)/2^{N1a}+Y1a(t+1) = SMDa(t)+Y1a(t+1)(1-2^{-N1a})$.

The delay unit 14 delays the signal $SMDa(t)+Y1a(t+1)(1-2^{-N1a})$ by one control cycle t to generate the integrated signal Y1a(t+1).

The bit shifter 15 shifts the integrated signal Y1a(t+1) by the number of bits defined by the first averaging coefficient N1a outputted from the first averaging coefficient provider 150a1 to generate the averaged signal $Y1a(t+1)/2^{N1a}$. This averaged signal $Y1a(t+1)/2^{N1a}$ corresponds to the average value of $2^{N1a}$ data values of the modulated digital signal SMDa supplied to the first level detector LD1a. In this sense, the number of shift bits n defines the number of data values required for the bit shifter 15 to calculate the average value. That is, $2^n$ is the number of data values required for the first level detector LD1a to calculate the average value of the received modulated digital signal SMDa, and the number of shift bits n is the averaging coefficient. Therefore, $2^n$ is hereinafter referred to as the number of data values for averaging.

The first averaging coefficient provider 150a1 is means for providing the bit shifter 15 with the first averaging coefficient N1a defining the averaging coefficient n. For example, to calculate the average of 4096 ($2^{12}$) data values ($2^n=4096$), the bit shifter 15 is supplied by the first averaging coefficient provider 150a1 with the first averaging coefficient N1a indicating n=12. The bit shifter 15 then sets the value "12" indicated by the first averaging coefficient N1a as the averaging coefficient n. With this, the bit shifter 15 finds the average value of $2^{12}$ data values of the output from the delay unit 14, and then outputs the first level signal SL1a.

By appropriately setting the value of the averaging coefficient n, how many frequency fluctuations of the digital broadcast wave Srf are to be followed is controlled. The number of data values used for finding the average value is 4096 when n=12, 2048 when n=11, and 1024 when n=10. As such, the larger the number of shift bits, the more data values are required, and therefore it becomes more difficult to follow the frequency-fluctuating signal.

For this reason, the number of shift bits n is set to be relatively large in order not to make the first automatic gain controller AGC1a follow the frequency fluctuations of the digital broadcast wave Srf. In the present embodiment, for setting the number of shift bits n to preferably be 11, the first averaging coefficient provider 150a1 outputs the first shift bit parameter N1a having a value of "11" to the bit shifter 15. That is, in the first level detector LD1a (first automatic gain controller AGC1a), $2^{11}$ (2048) data values are used to find the average value. Note that the value of the first shift bit parameter N1a is determined based on a processing balance in the whole digital broadcast receiving apparatus RPa, especially in consideration of the frequency of the digital broadcast wave Srf and the constant G. Consequently, the first shift bit parameter N1a may take any appropriate value other than 11 as long as frequency fluctuations of the digital broadcast wave Srf cannot be followed.

Figure 3:
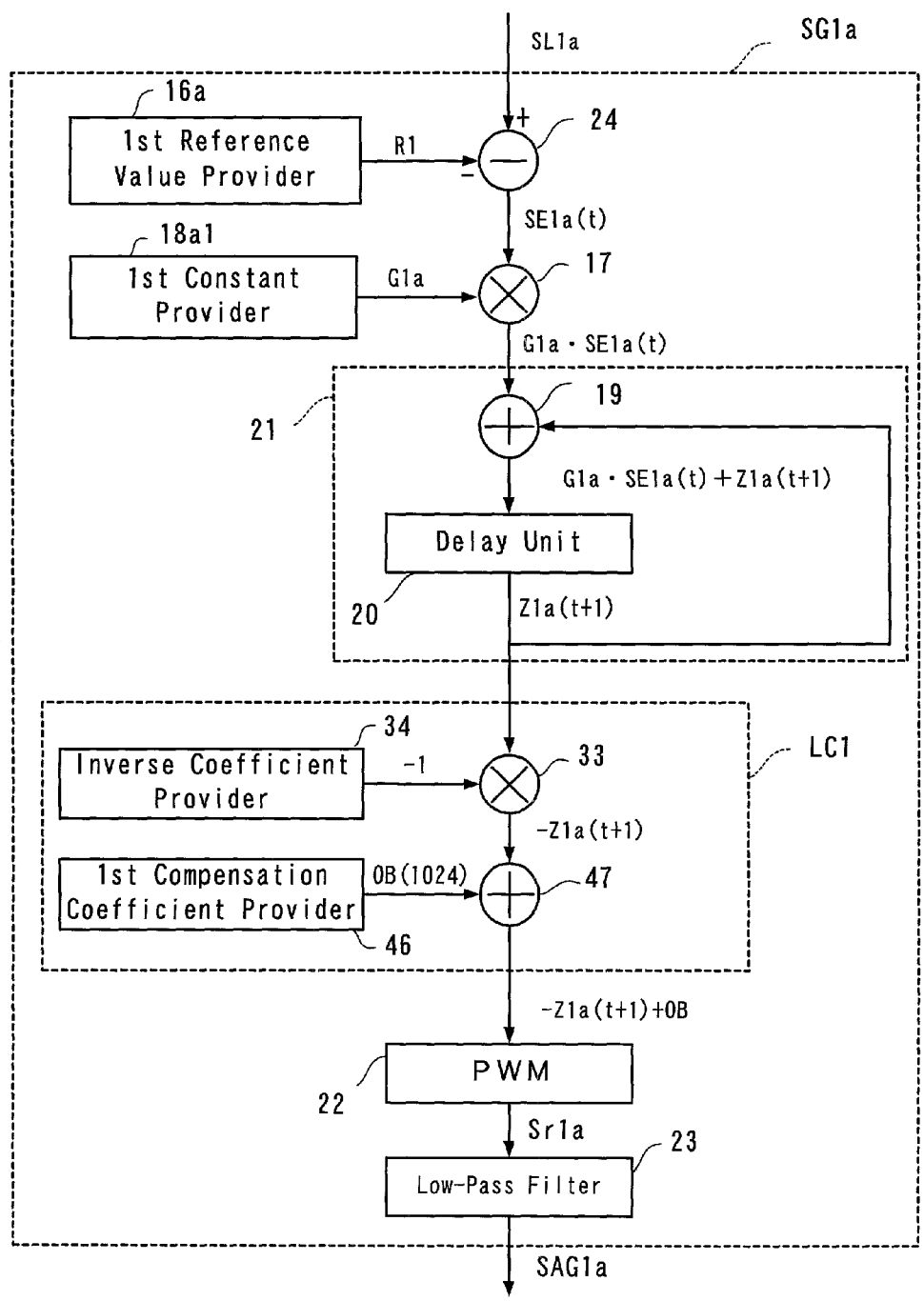
FIG. 3 is a block diagram showing the structure of a first AGC signal generator shown in FIG. 1.

With reference to FIG. 3, the above first AGC signal generator SG1a is described next. The first AGC signal generator SG1a includes a first reference value provider 16a, the subtractor 24, the multiplier 17, a first constant provider 18a1, the integrator 21, a first level converter LC1, the PWM 22, and the low-pass filter 23. The first level converter LC1 includes the multiplier 33, the inverse coefficient provider 34, the compensation coefficient provider 46, and the adder 47. The integrator 21 includes the adder 19 and the delay unit 20, The subtractor 24 finds an error between the first level signal SL1a provided by the first level detector LD1a and the first reference value R1 provided by the first reference value provider 16a to generate an error signal SE1a. The multiplier 17 multiplies the error signal SE1a found in the subtractor 24 by a first constant G1a provided by the first constant provider 18, and outputs the multiplication result to the integrator 21. Consequently, the gain of a loop formed by the tuner 2, the first level detector LD1a, and the first AGC signal generator SG1a is adjusted. In the integrator 21, the delay unit 20 delays the output from the multiplier 17 by one control cycle, and then the adder 19 adds it to the current output. As such, the integrator 21 integrates the output from the multiplier 17 to generate an integrated signal Z1a.

In the first level converter LC1, the multiplier 33 multiplies the integrated signal Z1a by an inverse coefficient "−1" received from the inverse coefficient provider 34, thereby inverting the polarity of the integrated signal Z1a to generate −Z1a.

The adder 47 adds the first compensation coefficient OB supplied by the compensation coefficient provider 46 to −Z1a supplied by the multiplier 33 to generate −Za+OB. The PWM 22 modulates the pulse width of the signal −Za+OB supplied by the adder 47 to generate a square-wave signal Sr1a. The low-pass filter 23 extracts low-frequency components from the square-wave signal Sr1a supplied by the PWM 22 to generate the first gain control signal SAG1a.

In the above first AGC signal generator SG1a, if the first level signal SL1a having a positive value outputted from the first level detector LD1a is larger than a first reference value R1, the error signal SE1a outputted from the integrator 21 has a positive value. By appropriately setting the value of the first reference value R1, the level of the modulated analog signal SMAa supplied to the A/D converter 2 can be adjusted. That is, in the digital broadcast receiving apparatus RPa, the first reference value R1 is so determined as to arbitrarily set the appropriate level of the modulated analog signal SMAa.

If the first constant G1a is set to have a relatively large value, frequency fluctuations of the digital broadcast wave Srf can be followed more easily. Therefore, in the present embodiment, the first constant G1a in the first automatic gain controller AGC1a is preferably set to 1 so that frequency fluctuations of the digital broadcast wave Srf are not followed.

The integrator 21 is provided for smoothly varying the signal G1a·SE1a outputted from the multiplier 17 with time. The first level converter LC1 is provided for normalizing the value of the integrated signal Z1a outputted from the integrator 21 so that the integrated signal Z1a takes a value larger than the first reference value R1 before being processed by the PWM 22. For this reason, the inverse coefficient provider 34 provides the inverse coefficient having a predetermined negative value to the multiplier 33 to invert the polarity of the integrated signal Z1a. The compensation coefficient provider 46 provides the compensation coefficient OB having a predetermined value for compensating the inverted integrated signal Z1a (−Z1a) to be a positive value.

The value of the compensation coefficient OB is determined based on the inverse coefficient provided by the inverse coefficient provider 34 and the number of output bits of the integrator 21. Now, consider the case where the inverse coefficient is −1, and the number of output bits is 11. In this case, the integrated signal Z1a takes a value in the range of −1024 to +1023. If the output of the integrator 21 is set to 11 bits (1024), the value of −Z+OB outputted from the adder 47 falls within the range of 0 to +2047. The value of −Z+OB outputted from the adder 47 is +1024 (OB) if the output from the integrator 21 is 0, while falling within a range of +1025 to +2048 if negative. As such, the first level converter LC1 is so structured as to enable correct gain control according to fluctuations of the digital broadcast wave Srf. In other words, the first level converter LC1 converts the value of the integrated signal Z1a into an integer equal to or larger than 0.

Described below is signal processing carried out by the first AGC signal generator SG1a in an arbitrary control cycle t. For the purpose of simplifying the description, the control cycle t may be simply referred to as "t", and each signal may be represented only by its symbol herein. The subtractor 24 subtracts the first reference value R1 provided by the first reference value provider 16a from the first level signal SL1a supplied by the first level detector LD1a to generate the error signal SE1a(t).

The multiplier 17 multiplies SE1a (t) received from the subtractor 24 by the first constant G1a received from the first constant provider 18a1 to generate G1a·SE1a(t). In the present embodiment, the first constant G1a is preferably set to 1 so that the frequency fluctuations of the digital broadcast wave Srf cannot be followed. Note that the first constant G1a is determined based on a processing balance in the whole digital broadcast receiving apparatus RPa, especially in consideration of the frequency of the digital broadcast wave Srf and the first number of shift bits n. Therefore, the first constant G1a can take any appropriate value other than 1 as long as the first automatic gain controller AGC1a is prevented from following the frequency fluctuations of the digital broadcast wave Srf.

In the integrator 21, the adder 19 adds the G1a SE1a (t) supplied by the multiplier 17 to the integrated signal Z1a (t+1) supplied by the delay unit 20 to generate G1a·SE1a (t)+Z1a(t+1).

The delay unit 20 delays G1a·SE1a(t)+Z1a(t+1) received from the adder 19 by one control cycle t to generate the integrated signal Z1a(t+1).

In the first level converter LC1, the inverse coefficient provider 34 multiplies the integrated signal Z1a(t+1) received from the adder 19 by the inverse coefficient "−1" received from the inverse coefficient provider 34 to generate −Z1a(t+1).

The adder 47 adds −Z1a(t+1) supplied by the multiplier 33 to the compensation coefficient OB provided by the compensation coefficient provider 46 to generate −Z1a(t+1)+OB.

The PWM 22 converts the pulse width of −Z1a(t+1)+OB supplied by the first level converter LC1 to generate the square-wave signal Sr1a. The low-pass filter 23 extracts low-frequency components from the square-wave signal Sr1a supplied by the PWM 22 to generate the first gain control signal SAG1a at a desired stable level.

Figure 4:
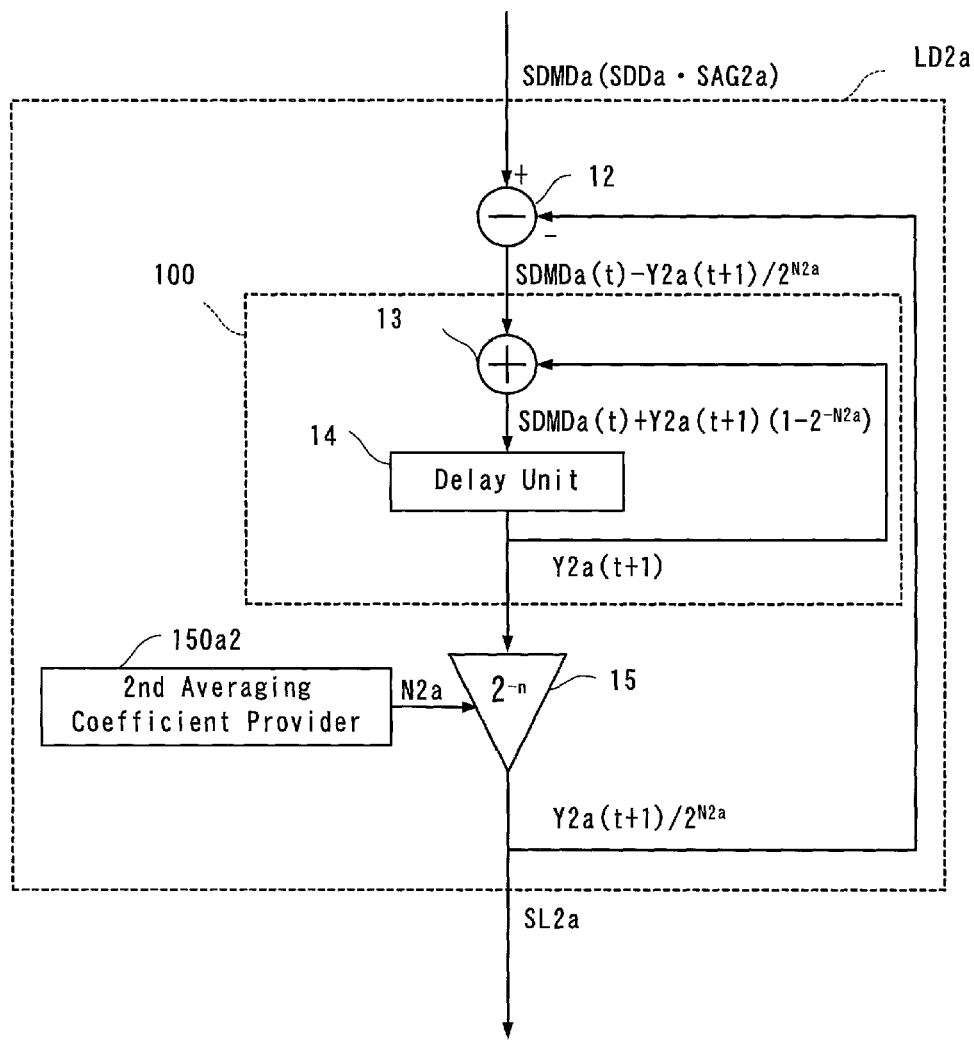
FIG. 4 is a block diagram showing the structure of a second level detector shown in FIG. 1.

With reference to FIG. 4, the above second level detector LD2a is described next. The second level detector LD2a is similar in structure to the first level detector LD1a already described with reference to FIG. 2. However, in the second level detector LD2a, a second averaging coefficient provider 150a2 is provided in place of the first averaging coefficient provider 150a1, and a demodulated second digital signal SDMDa is provided in place of the modulated digital signal SMDa. Therefore, mainly described herein are features unique to the second level detector LD2a, and similar features are not described herein.

As with the first averaging coefficient provider 150a1, the second averaging coefficient provider 150a2 outputs a second shift bit parameter N2a defining the number of shift bits n of the bit shifter 15. That is, the second averaging coefficient provider 150a2 defines the averaging coefficient n in the second level detector LD2a. However, in the second automatic gain controller AGC2a, to follow the frequency fluctuations of the received demodulated second digital signal SDMDa, the number of shift bits n is preferably set equal to or smaller than the first shift bit parameter N1a. In other words, the second shift bit parameter N2a and the first shift bit parameter N1a have a relation represented by the following equation (1).

$$N1a \geq N2a \tag{1}$$

As can be seen from the above equation (1), the second shift bit parameter N2a can take the same value as the first shift bit parameter N1a. This is established based on the balance among the first constant G1a, a second constant G2a (will be described later), and the frequency of the digital broadcast wave Srf. N1a=N2a tends to be established especially when the number of shift bits n is relatively small (n is equal to or smaller than 8, for example). In the present embodiment, by way of example only, Na1 is set to 11, and Na2 is to 8. If N1a is 11, the average value can be found by the first level detector LD1a using $2^{11}$ (2048) data values. If N2a is 8, the average value can be found by the second level detector LD2a using 28 (256) data values.

Briefly described below is signal processing carried out in the second level detector LD2a in an arbitrary control cycle t. The subtractor 12 subtracts the averaged signal $Y2a(t+1)/2^{N2a}$ supplied by the bit shifter 15 from the demodulated second digital signal SDMDa (SDDa·SAG2a) with gain controlled by the second automatic gain controller AGC2a outputted from the multiplier 8 to generate $SDMDa(t)-Y2a(t+1)/2^{N2a}$. In this case, to follow the frequency fluctuations of the demodulated second digital signal SDMDa, the second shift bit parameter N2a is set to 8.

In the integrator 100, the adder 13 adds $SDMDa(t)-Y2a(t+1)/2^{N2a}$ supplied by the subtractor 12 to the integrated signal Y2a(t+1) supplied by the delay unit 14 to generate $SDMDa(t)-Y2a(t+1)/2^{N2a}+Y2a(t+1)=SDMDa(t)+Y2a(t+1)(1-2^{-N2a})$.

The delay unit 14 delays $SDMDa(t)+Y2a(t+1)(1-2^{-N2a})$ received from the adder 13 by one control cycle t to generate the integrated signal Y2a(t+1).

The bit shifter 15 shifts Y2a(t+1) received from the delay unit 14 by the number of bits defined by the second averaging coefficient N2a outputted from the second averaging coefficient provider 150a2 to generate the averaged signal $Y2a(t+1)/2^{N2a}$. This averaged signal $Y2a(t+1)/2^{N2a}$ corresponds to the average value found based on $2^{N2a}$ data values of the demodulated second digital signal SDMDa supplied to the second level detector LD2a.

Figure 5:
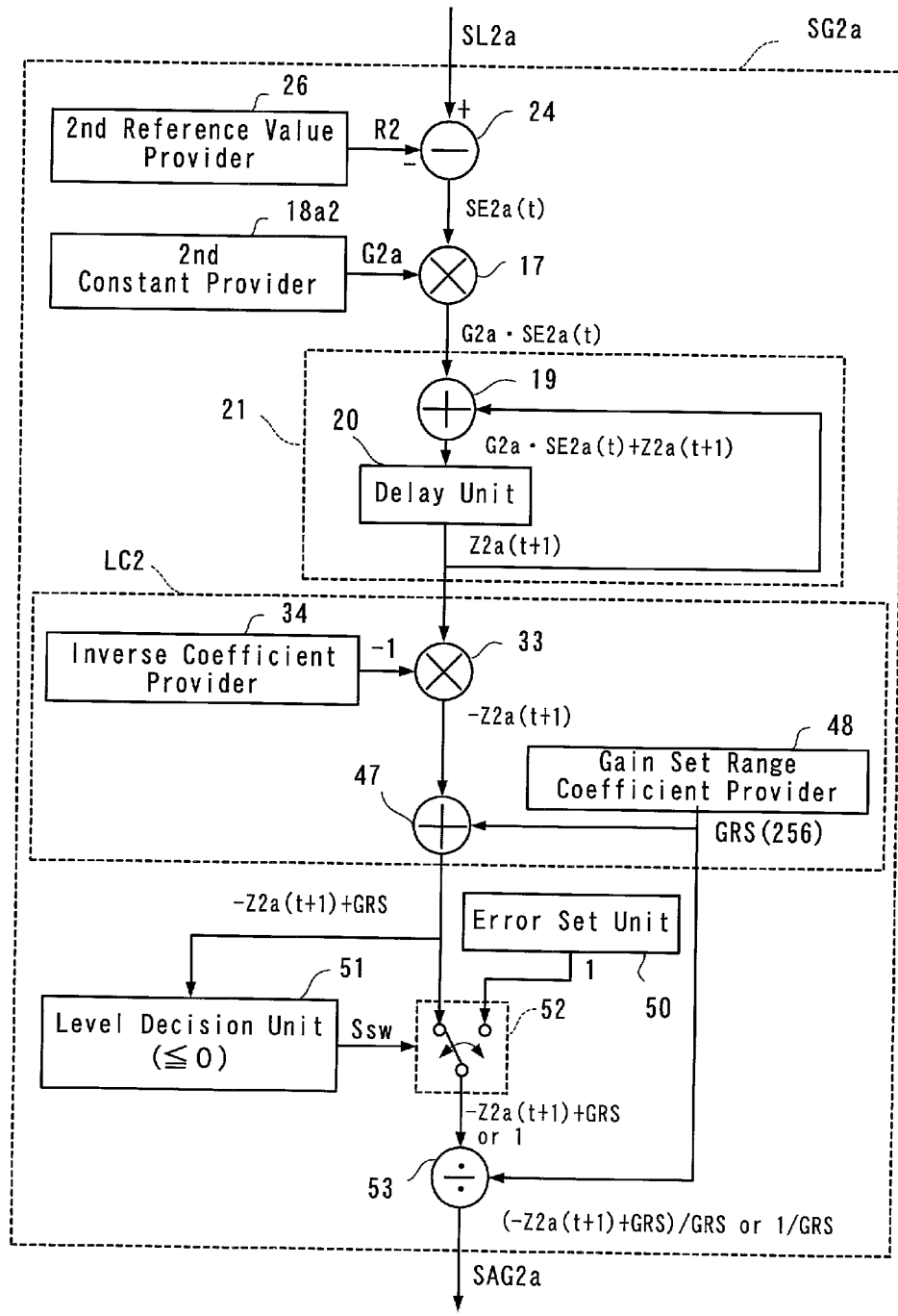
FIG. 5 is a block diagram showing the structure of a second AGC signal generator shown in FIG. 1.

With reference to FIG. 5, the above second AGC signal generator SG2a is described next. The second AGC signal generator SG2a is similar in structure to the first AGC signal generator SG1a already described with reference to FIG. 3. That is, the first reference value provider 16a of the first AGC signal generator SG1a is replaced with a second reference value provider 26; the first constant provider 18a1 with a second constant provider 18a2; the first level converter LC1 with a second level converter LC2; and the PWM 22 and the low-pass filter 23 with an error set unit 50, a level decision unit 51, a switch 52, and a divider 53. Also, in the second AGC signal generator SG2a, the second level signal SL2a is supplied in place of the first level signal SL1a. Therefore, mainly described herein are features unique to the second AGC signal generator SG2a, and other matters are not described unless otherwise required.

The second reference value provider 26 outputs a second reference value R2 to the subtractor 24. The second reference value R2 can adjust the demodulated second digital signal SDMDa to a desired level. That is, the second reference value R2 is so determined as to arbitrarily set the level of the modulated analog signal SMAa that is appropriate in the digital broadcast receiving apparatus RPa.

The second constant provider 18a2 outputs the second constant G2a to the multiplier 17. Note that, in the second automatic gain controller AGC2a, the second constant G2a is set relatively large to follow the frequency fluctuations of the received demodulated second digital signal SDMDa. In the present embodiment, the first constant G1a is preferably set to 1, while the second constant G2a to 16. The first and second constants G1a and G2a have a relation represented by the following equation (2).

$$G1a < G2a \qquad (2)$$

As with the first level converter LC1, the second level converter LC2 includes the multiplier 33, the inverse coefficient provider 34, and the adder 47, and further includes a gain set range coefficient provider 48 in place of the compensation coefficient provider 46. The gain set range coefficient provider 48 supplies to the adder 47 a gain set range coefficient GRS for setting the gain in the multiplier 8 in a desired range. This gain set range coefficient GRS will be described later.

The subtractor 24 finds an error between the second level signal SL2a outputted from the second level detector LD2a and the second reference value R2 provided by the second reference value provider 26 to generate a second error signal SE2a.

The multiplier 17 multiplies the second error signal SE2a received from the subtractor 24 by G2a provided by the second constant provider 18a2 to generate G2a·SE2a for output to the integrator 21. Consequently, the gain of a loop formed by the multiplier 8, the second level detector LD2a, and the second AGC signal generator SG2a is adjusted.

The integrator 21 integrates G2a·SE2a by delaying, in the delay unit 20, G2a·SE2a received from the multiplier 17 through the adder 19 by one control cycle, and then adding, in the adder 19, the result to the current output from the multiplier 17.

The multiplier 33 multiplies the integrated signal Z2a received from the integrator 21 by "−1" provided by the inverse coefficient provider 34 to invert the polarity of the signal, thereby generating −Z2a.

The adder 47 adds −Z2a received from the multiplier 33 to GRS (256 in the present embodiment) provided by the gain set range coefficient provider 48 to output −Z2a+GRS (256) to the level decision unit 51 and the switch 52.

The level decision unit 51 decides the level of −Z2a+GRS(256) outputted from the adder 45 to generate a level decision signal indicating the decision result. Note that, in the present embodiment, the level decision unit 51 compares the value of −Z2a+GRS(256) with a threshold 0, and generates a binary level decision signal Ssw identifying either that the value is equal to or smaller than 0 or that the value is larger than 0.

The switch 52 is connected to an output port of the adder 47, an output port of the error set unit 50, an input port of the divider 53, and an output port of the level decision unit 51. Based on the level decision signal Ssw outputted from the level decision unit 51, the switch 52 selects either one of the output ports of the adder 47 or the error set unit 50 for connection to the input port of the divider 53.

As a result, either one of a value "1" supplied by the error set unit 50 or −Z2a+GRS(256) supplied by the adder 47 is inputted to the divider 53. In more detail, the switch 52 supplies −Z2a+GRS outputted from the adder 47 to the divider 53 if −Z2a+GRS is positive, while supplying "1" outputted from the error set unit 50 thereto if negative.

The divider 53 divides −Z2a+GRS(256) outputted from the switch 52 or "1" outputted from the error set unit 50 by "256" provided by the gain set range coefficient provider 48, and outputs the result as a second gain control signal SAG2a.

The gain set range coefficient GRS is now briefly described. The gain set range coefficient GRS is so determined as to set the gain in the multiplier 8 in a desired range. When the inverse coefficient is −1 and the number of output bits of the integrator 21 is 11, the integrated signal Z2a takes a value in a range of −1024 to +1023. When the gain set range coefficient GRS is exemplarily set to 8 bits (256), the value of −Z2a+GRS outputted from the multiplier 33 falls within a range of −768 to +1279. If the level decision unit 51 decides −Z2a+GRSaspositive, −Z2a+GRS is outputted as it is to the divider 53.

On the other hand, if decided as negative, "1" supplied by the error set unit 50 is outputted to the divider 53 instead of −Z2a+GRS. That is, the output from the switch 52 takes a value in a range of 1 to 1279. As a result, the divider 53 divides the value in the range of 1 to 1279 by the gain set range coefficient GRS (256) to generate the second gain control signal SAG2a having a value in a range of 1/256 to 1279/256. That is, the controlled gain in the multiplier 8 can be set in a range of 1/256 (approximately 0) to 1279/256 (approximately 5). As such, the gain set range can be adjusted by arbitrarily setting the gain set range coefficient GRS with respect to the number of output bits of the integrator 21.

The number of output bits, the gain set range coefficient GRS, and other parameters may take arbitrary values other than those exemplarily described above. If the present apparatus is actually brought to the market, it is preferable to set the number of output bits of the integrator 21 to 15 (−16384 to +16383) and the gain set range coefficient GRS to 9 bits (1024). In this case, the gain set range is from 1/1024 (approximately 0) to 16383/1024 (approximately 16). With such setting, the second automatic gain controller AGC2a can normally operate even if a large interference wave of an adjacent channel approximately 16 times larger than the digital broadcast wave is supplied to the second automatic gain controller AGC2a.

Briefly described below is signal processing carried out by the second AGC signal generator SG2a in an arbitrary control cycle t. The subtractor 24 subtracts the second reference value R2 provided by the second reference value provider 26 from the second level signal SL2a supplied by the second level detector LD2a to generate the second error signal SE2a(t).

The multiplier 17 multiplies the second error signal SE2a(t) outputted from the subtractor 24 by the second constant G2a outputted from the second constant provider 18a2 to generate G2a·SE2a(t).

In the integrator 21, the adder 19 adds G2a·SE2a(t) supplied by the multiplier 17 to the integrated signal Z2a (t+1) outputted from the delay unit 20 to generate G2a·SE2a(t)+Z2a(t+1). As described above, to follow the frequency fluctuations of the demodulated second digital signal SDMDa, the second constant G2a is set to be relatively large value (16).

The delay unit 20 delays G2a·SE2a(t)+Z2a(t+1) by one control cycle t to generate the integrated signal Z2a(t+1). In the second level converter LC2, the multiplier 33 multiplies the integrated signal Z2a(t+1) received from the delay unit 20 by the inverse coefficient "−1" received from the inverse coefficient provider 34 to generate −Z2a(t+1).

The adder 47 adds the gain set range coefficient GRS (256, in the present embodiment) to −Z2a(t+1) to generate −Z2a(t+1)+GRS.

The level decision unit 51 generates the level decision signal Ssw indicating whether −Z2a(t+1)+GRS supplied by the adder 47 of the second level converter LC2 is not more than 0, and outputs the signal to the switch 52.

In response to the level decision signal Ssw from the level decision unit 51, the switch 52 selectively outputs, to the divider 53, −Z2a(t+1)+GRS supplied by the adder 47 or "1" supplied by the error set unit 50.

That is, the second AGC signal generator SG2a finds an error (the second error signal SE2a) between the signal level found by the second level detector LD2a (second level signal SL2a) and the second reference value R2 for controlling the level of the second gain control signal SAG2a to a desired level. Then, the second error signal SE2a is multiplied, in the multiplier 17, by the second constant G2a for determining the loop gain in the second automatic gain controller AGC2a. The multiplication result then goes through the adder 19 and the delay unit 20 that form the integrator 21; the multiplier 33 forming an inverting circuit with the constant "−1" provided thereto; the adder 47; the switch 52; and the divider 53, and is then fed back to the multiplier 8.

In the case where the output of the integrator 21 is 11, the integrated signal Z2a outputted therefrom takes a value in a range of −1024 to +1023. In the case where the gain set range coefficient GRS is set to 256, −Z2a+256 from the adder 47 becomes equal to or smaller than 255. That is, if the second level signal SL2a outputted from the second level detector LD2a is larger than the second reference value R2, the output value from the adder 47 becomes equal to or smaller than 255. The switch 52 outputs "1" if −Z2a+256 outputted from the adder 47 is equal to or smaller than 0, while outputting −Z2a+256 if positive. Therefore, after division by 256 in the divider 53, the output therefrom, that is, the second gain control signal SAG2a, takes a value in a range of 1/256 to 255/256, and is supplied to the multiplier 8. Consequently, the demodulated second digital signal SDMDa outputted from the multiplier 8 is smaller in value than the demodulated digital signal SDDa received thereby.

If the value of the second level signal SL2a outputted from the second level detector LD2a is equal to the second reference value R2, the error signal SE2a outputted from the subtractor 24 is 0. Therefore, the multiplier 17 supplies G2a·SE2a having 0 value to the integrator 21. The integrator 21 adds up SE2a calculated for each time, and outputs 0. The output of the integrator 21 is represented by a value in a range of −1024 to +1023. The output of the multiplier 33 is 0, and the output of the adder 47 is 0+256=256.

In other words, if the second level signal SL2a outputted from the second level detector LD2a is equal in value to the second reference value R2, the output from the adder 47 takes a value of 256. The switch 52 outputs "1" if the output of the adder 47 is not more than 0, while outputting the output value of the adder 47 if positive. Therefore, when the adder 47 outputs 256, the divider 53 divides the output of the switch circuit 52, that is, 256, by 256 to produce "1" for output to the multiplier 8. Thus, the demodulated second digital signal SDMDa outputted from the multiplier 8 becomes equal in value to the demodulated digital signal SDDa received thereby.

On the other hand, if the second level signal SL2a is smaller in value than the second reference value R2, the second error signal SE2a from the subtractor 24 has a negative value. The multiplier 17 multiplies the negative value by the second constant G2a to produce G2a·SE2a having a negative value for output to the integrator 21. The integrator 21 adds up the error signals calculated for each time, and outputs the integrated signal Z2a. The output of the integrator 21 is represented by a value in a range of −1024 to +1023. The output of the multiplier 33, that is, −Z2a, takes a value in a range of −1023 to +1024. Therefore, −Z2a+GRS (256) outputted from the adder 47 takes a value equal to or smaller than 255.

In other words, if the second level signal SL2a outputted from the second level detector LD2a is larger in value then the second reference value R2, the output from the adder 47 takes a value larger than 256. The switch 52 outputs "1" if −Z2a+GRS (equal to or smaller than 255) outputted from the adder 47 is not more than 0, while outputting −Z2a+GRS (equal to or smaller than 255) if positive. Therefore, when the divider 53 divides the output of the switch circuit 52 by 256, the result takes a value of 1/256 to (1023+256)/256, and is supplied as the second gain control signal SAG2a to the multiplier 8. Thus, the multiplier 8 outputs the demodulated second digital signal SDMDa larger in value than the demodulated digital signal SDDa.

Figure 6:
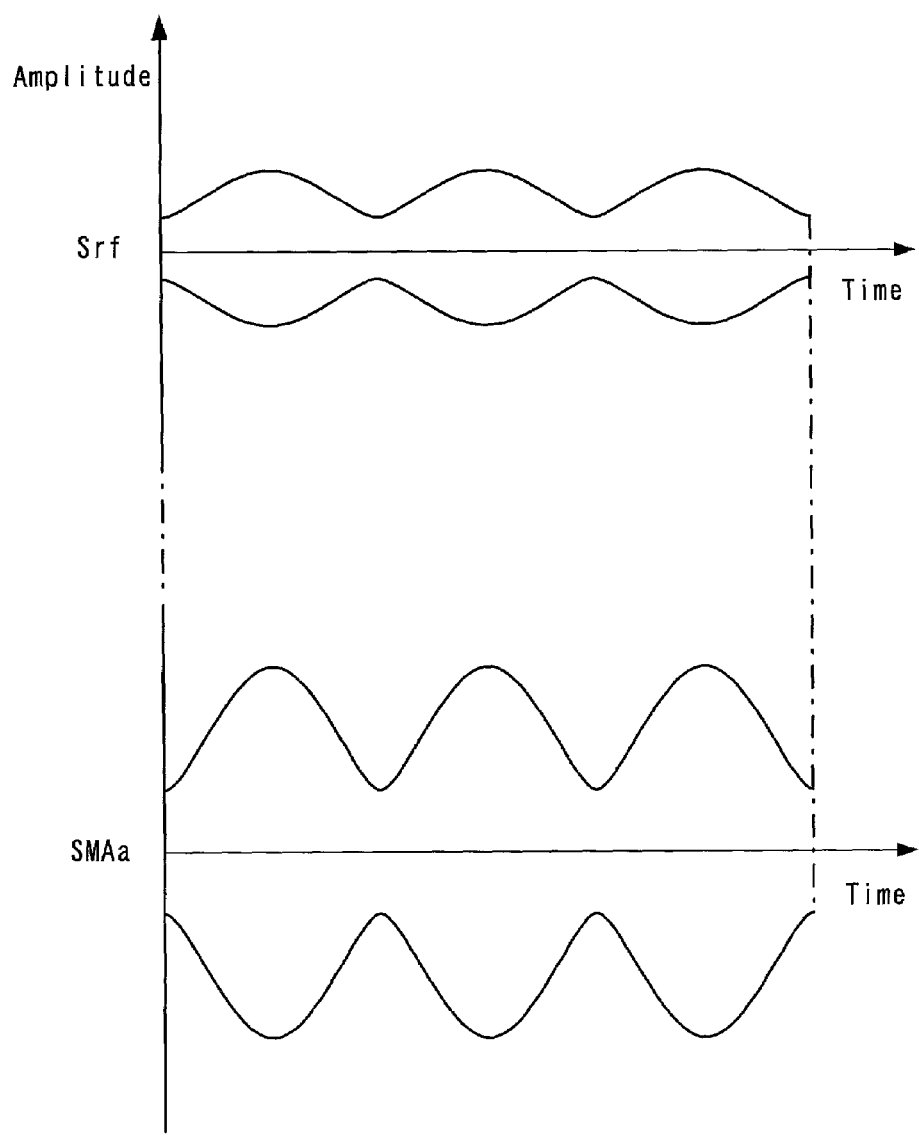
FIG. 6 is a diagram showing waveforms of a digital broadcast wave and a modulated analog signal observed in the digital broadcast receiving apparatus shown in FIG. 1.

With reference to FIG. 6, a relation between the digital broadcast wave Srf supplied to the tuner 2 and the modulated analog signal SMAa outputted therefrom is now described. In FIG. 6, envelope waveforms of the digital broadcast wave Srf and the modulated analog signal SMAa are schematically illustrated.

As described above, in the first AGC signal generator SG1a, the first constant provider 18a1 provides the first constant G1a having a relatively small value ("1", for example) to the multiplier 17. As a result, the digital broadcast wave Srf is controlled only in level to a predetermined value without any change in oscillation amplitude and oscillation frequency, and the modulated analog signal SMAa outputted from the tuner 2 is so controlled as never to follow the level fluctuations of the level-fluctuating signal at the tuner 2.

For following the level fluctuations of the digital broadcast wave Srf, by way of example only, 4096 (N1a=12) data values are used for level detection by the bit shifter 15 of the first level detector LD1a; 128 (N2a=7) data values are used for level detection by the bit shifter 15 of the second level detector LD2a; the first constant G1a of the first AGC signal generator SG1a is set to 1; and the second constant G2a of the second AGC signal generator SG2a is set to 16.

In a system which controls the gain of the tuner by a control voltage from the first automatic gain controller AGC1a (first gain control signal SAG1a), a long delay time occurs while the detection result of the first level detector LD1a goes through the first automatic gain controller AGC1a to the tuner 2. On the other hand, a delay time occurring while the detection result of the second level detector LD2a goes through the second automatic gain controller AGC2a to the multiplier 8 is extremely short. Thus, it has been confirmed through experiments that the second automatic gain controller AGC2a can follow frequency fluctuations larger than those followable by the first automatic gain controller AGC1a. Therefore, the first automatic gain controller AGC1a is so structured as never to follow frequency-fluctuating signals, and only the second automatic gain controller AGC2a follows such signals.

In the above conventional digital broadcast receiving apparatus Rc, only the automatic gain controller AGC is used to follow the digital broadcast wave Sr fluctuating in frequency over 100 Hz. For this reason, a relatively small number of data values, 128 (n=7) values, for example, are used for level detection by the bit shifter 15 of the level detector LD. Here, if the constant G of the AGC signal generator is set larger (256, for example), the gain of the loop between the tuner 2 and the automatic gain controller AGC becomes so large as to cause the modulated digital signal SMD outputted from the tuner 2 to oscillate. In other words, the frequency fluctuations of the modulated digital signal SMD become too large to enable demodulation in the demodulator 7. The present embodiment, however, can solve such problem unique to the conventional digital broadcast receiving apparatus Rc.

Furthermore, in the present embodiment, two automatic gain controllers are provided: the first automatic gain controller AGC1a for controlling the tuner 2 and the second automatic gain controller AGC2a for control all in digital. In the first automatic gain controller, parameters not being able to follow frequency fluctuations at all are selected, while parameters capable of following them are selected only in the second automatic gain controller. With such structure, it has been experimentally confirmed that frequency fluctuations of up to 580 Hz can be followed.

In the above structured digital broadcast receiving apparatus RPa, the following components have features unique to the present embodiment and also those common to the other embodiments of the present invention: the modulated analog signal SMA, the modulated digital signal SMD, the demodulated first digital signal SDD, the demodulated second digital signal SDMD, the first automatic gain controller AGC1a, the first AGC signal generator SG1a, the first level detector LD1a, the first level signal SL1a, the first gain control signal SAG1a, the second automatic gain controller AGC2a, the second level detector LD2a, the second AGC signal generator SG2a, the averaged signal Y1a, the first shift bit parameter N1a, the first error signal SE1a, the first constant G1a, the integrated signal Z1a, the square-wave signal Sr1a, the averaged signal Y2a, the second shift bit parameter N2a, the second error signal SE2a, the second constant G2a, and the integrated signal Z3a. Therefore, each component is represented by a reference character with a suffix provided thereto for indicating a feature unique to each embodiment. In the above description, a suffix "a" indicates that the component is unique to the first embodiment. Similarly, in the second, third, and fourth embodiments described below, suffixes "b", "c", and "d", respectively, indicate that the component is unique to the respective embodiment. Components common to those embodiments are represented only by reference characters without any suffix.

Second Embodiment

With reference to FIGS. 7 through 12, described below is the digital broadcast receiving apparatus according to the second embodiment of the present invention exemplarily applied to receive a digital broadcast wave. Prior to that, the basic concept of the present embodiment is first described. In the above digital broadcast receiving apparatus RPa according to the first embodiment, when the digital broadcast wave RF including noise components over a predetermined value (for example, C/N is under 17.5 dB) is received, the modulated digital signal SMDa used for demodulation in the demodulator 7 always fluctuates in level. This reduces the demodulation capability of the demodulator 7.

More specifically, the demodulator 7 performs automatic frequency control at demodulation. The automatic frequency control is a process for generating an error signal through frequency error detection based on an input signal, and correcting the frequency error based on the generated error signal. However, if the input signal fluctuates in level, the detected frequency error fluctuates accordingly. If the digital broadcast wave Srf is in good condition. this frequency error fluctuation does not pose a significant problem. If the digital broadcast wave Srf is in bad condition with noise and other factors added thereto, however, the frequency error fluctuation significantly reduces the demodulation capability of the demodulator 7.

In other words, in the digital broadcast receiving apparatus RPa, if the input signal fluctuates in frequency within 100 Hz, the demodulator 7 can receive a signal without frequency fluctuation. The demodulator 7 detects the error between the received signal and the reference value for demodulation. If the received signal cyclically fluctuates, the detected error signal fluctuates accordingly. The frequency-fluctuating signal with a small amount of noise does not cause an error in the demodulator 7. However, the frequency-fluctuating signal with a large amount of noise causes an error in the demodulator 7. Specifically, the digital broadcast wave RF fluctuating in frequency within 100 Hz with noise at the C/N ratio under 17.5 db causes an error at automatic frequency control in the digital broadcast receiving apparatus RPa.

In this respect, in a digital broadcast receiving apparatus RPb according to the second embodiment of the present embodiment, a first automatic gain controller AGC1b corresponding to the first automatic gain controller AGC1a of the digital broadcast receiving apparatus RPa eliminates frequency fluctuations as much as possible from the digital broadcast wave Srf. Then, a second automatic gain controller AGC2b corresponding to the second automatic gain controller AGC2a further eliminates the remaining frequency fluctuations. By way of example only, the first automatic gain controller AGC1b eliminates low-frequency fluctuations under 100 Hz, and then the second automatic gain controller AGC2b eliminates high-frequency fluctuations between 100 Hz to 300 Hz.

In the digital broadcast receiving apparatus RPb according to the present embodiment, when the frequency of the digital broadcast wave Srf is 600 MHz, frequency fluctuations of approximately 300 Hz can be eliminated. These frequency fluctuations are equivalent to those caused by an object moving at 480 Km per hour toward the digital broadcast wave Srf. Consequently, in the present embodiment, an error at automatic frequency control can be prevented for a signal at the C/N ratio under 17 dB. Therefore, although followable frequency fluctuations in the second embodiment are smaller than those in the first embodiment, the C/N ratio can be improved by approximately 0.5 dB.

Figure 7:
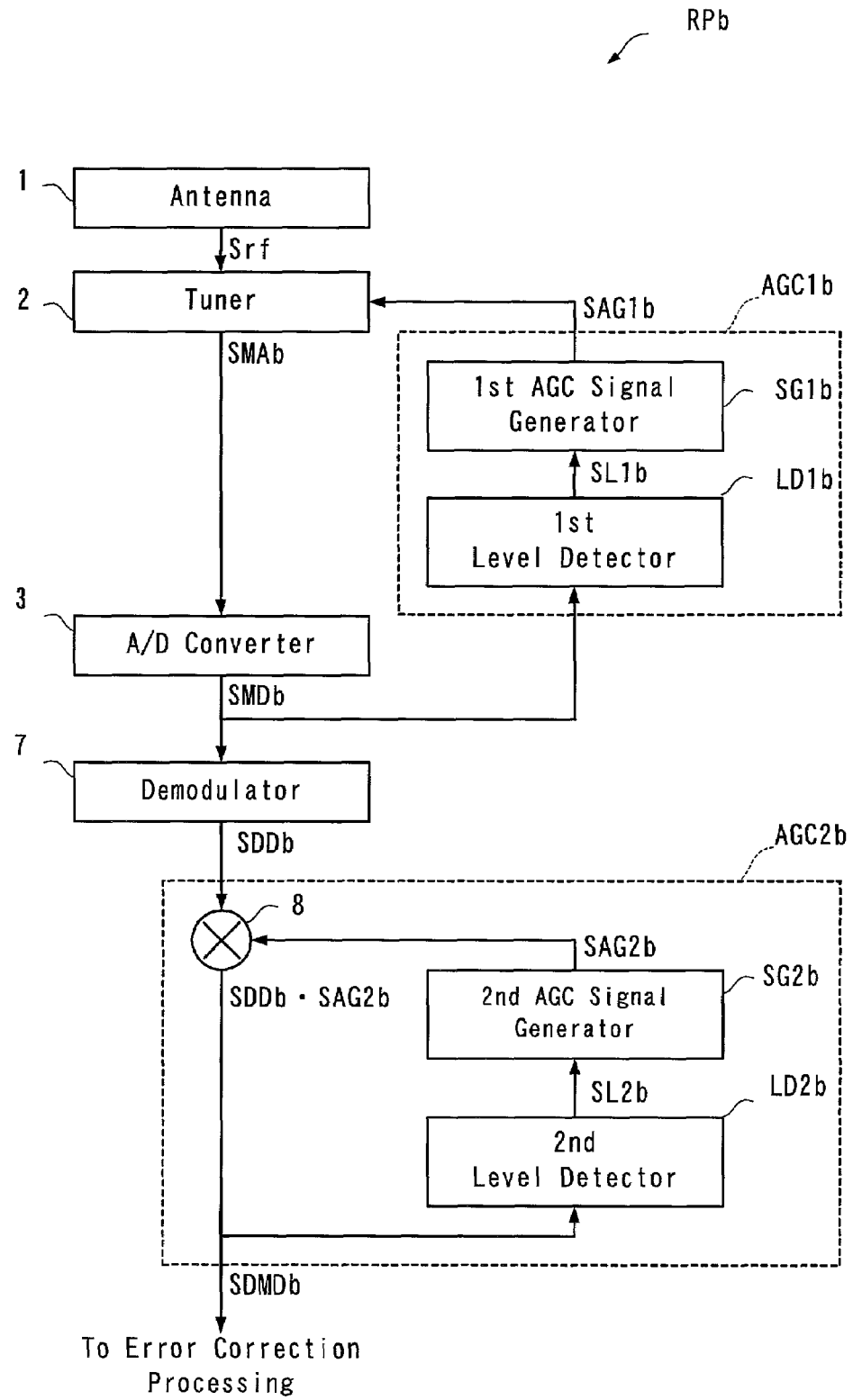
FIG. 7 is a block diagram showing the structure of a digital broadcast receiving apparatus according to a second embodiment of the present invention.

As shown in FIG. 7, the digital broadcast receiving apparatus RPb according to the present embodiment is similar in structure to the digital broadcast receiving apparatus RPa shown in FIG. 1, except that the first automatic gain controller AGC1b is provided in place of the first automatic gain controller AGC1a, and the second automatic gain controller AGC2b is provided in place of the second automatic gain controller AGC2a. The first automatic gain controller AGC1b includes a first level detector LD1b and a first AGC signal generator SG1b, while the second automatic gain controller includes a second level detector LD2b and a second AGC signal generator SG2b.

Mainly described below are features unique to the present embodiment. In the drawings, each component, signal and parameter unique to the present embodiment is represented and identified by a reference character with the suffix "b" added thereto. The same components and operations as those of the above first embodiment are not described herein.

Figure 8:
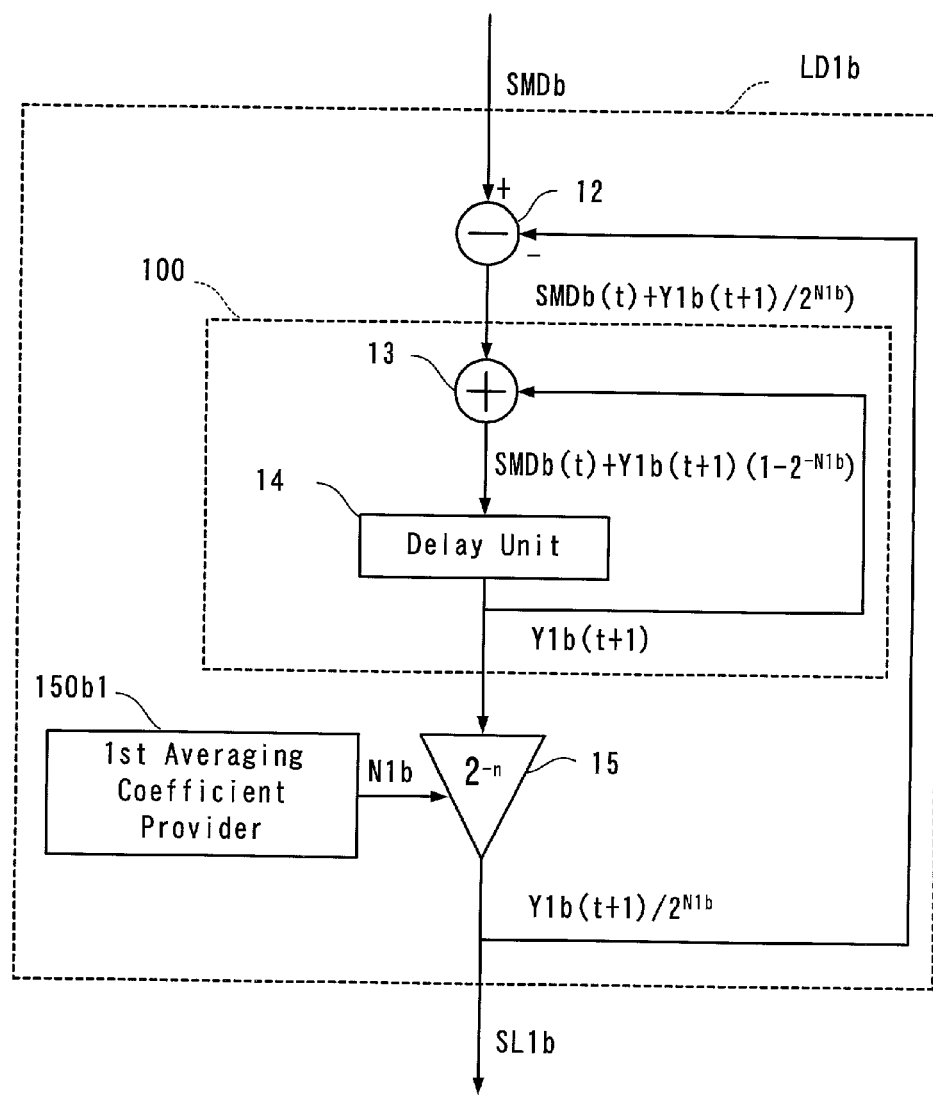
FIG. 8 is a block diagram showing the structure of a first level detector shown in FIG. 7.

In FIG. 8, the structure of the first level detector LD1b is shown. The first level detector LD1b is similar in structure to the first level detector LD1a shown in FIG. 2 except that a first averaging coefficient provider 150b1 is provided in place of the first averaging coefficient provider 150a1. As with the first averaging coefficient provider 150a1, the first averaging coefficient provider 150b1 outputs a first shift bit parameter Nib to the bit shifter 15.

In the present embodiment, the first shift bit parameter N1b is set slightly smaller than the first shift bit parameter N1a of the first level detector LD1a according to the above first embodiment. This is to enable the first automatic gain controller AGC1b to follow frequency fluctuations of the received digital broadcast wave Srf to some extent (under 100 Hz, for example). In the present embodiment, the first shift bit parameter N1b is preferably set to 8.

Therefore, the first shift bit parameter N1b and the first shift bit parameter N1a have a relation represented by the following equation (3).

$$N1a \geq N1b \quad (3)$$

As can be seen from the above equation (3), the first shift bit parameter N1b can take the same value as that of the first shift bit parameter N1a. Such relation is established based on the balance between first and second constants G1b and G2b described later and the frequency of the digital broadcast wave Srf. If the first shift bit parameter N1b is 8, the average value can be found in the first level detector LD1b using 28 (256) data values. Consequently, the first automatic gain controller AGC2a can carry out gain control following frequency fluctuations of the digital broadcast wave Srf more, compared with the first automatic gain controller AGC1a whose first shift bit parameter N1a is 11.

Figure 9:
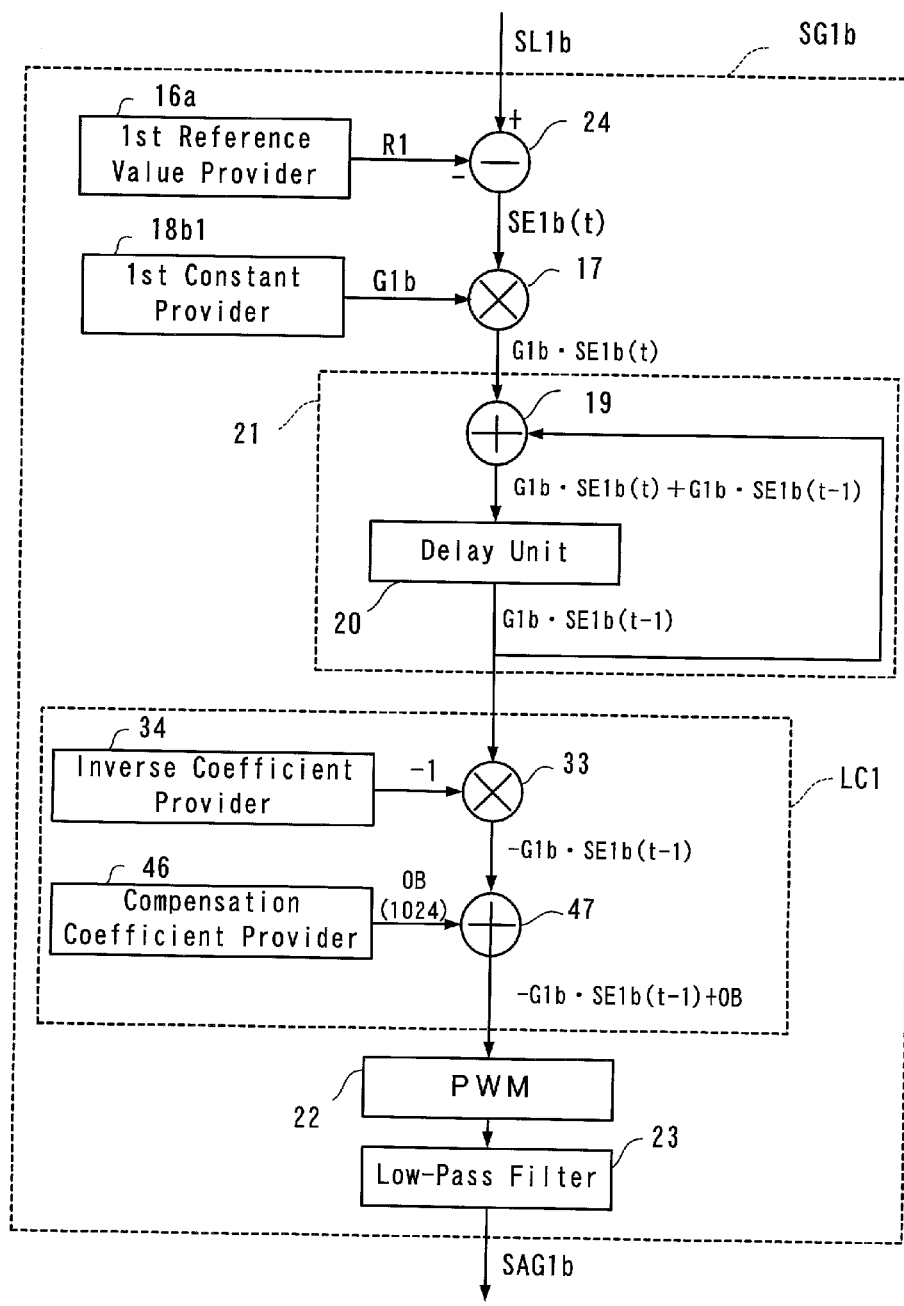
FIG. 9 is a block diagram showing the structure of a first AGC signal generator shown in FIG. 7.

In FIG. 9, the structure of the first AGC signal generator SG1b is shown. The first AGC signal generator SG1b is similar in structure to the AGC signal generator SG1a shown in FIG. 3 except that a first constant provider 18b1 is provided in place of the first constant provider 18a1. As with the first constant provider 18a1, the first constant provider 18b1 outputs a first constant G1b to the multiplier 17. In the present embodiment, the first constant G1b is set larger than the first constant G1a of the first AGC signal generator SG1a according to the above first embodiment. This is to enable the first automatic gain controller AGC1b to follow frequency fluctuations of the received digital broadcast wave Srf to some extent (under 100 Hz, for example). In the present embodiment, the first constant G1b is preferably set to 8.

Therefore, the first constant G1b and the first constant G1a have a relation represented by the following equation (4).

$$G1a < G1b \quad (4)$$

As stated above, the first shift bit parameter N1b and first constant G1b are set to values more followable to frequency fluctuations of the digital broadcast wave Srf, compared with the first shift bit parameter N1a and the first constant G1a respectively corresponding thereto. Consequently generated is a first gain control signal SAG1b more followable to frequency fluctuations of the digital broadcast wave Srf compared with the first gain control signal SAG1a, and supplied to the tuner 2.

Then, with the gain controlled by this gain control signal SAG1b, the tuner 2 generates a modulated analog signal SMAb more followable to frequency fluctuations of the digital broadcast wave Srf for output to the demodulator 7. As described above, this modulated analog signal SMAb is a signal whose frequency fluctuations under 100 Hz are eliminated.

The A/D converter 3 converts the modulated analog signal SMAb supplied by the tuner 2 to a modulated digital signal SMDb, and outputs it to the first automatic gain controller AGC1b and the demodulator 7. The first automatic gain controller AGC1b generates, based on the modulated digital signal SMDb, the first gain control signal SAG1b in the above described manner. The demodulator 7 demodulates the modulated digital signal SMDb to generate a demodulated first digital signal SDDb, and outputs it to the second automatic gain controller AGC2b.

Figure 10:
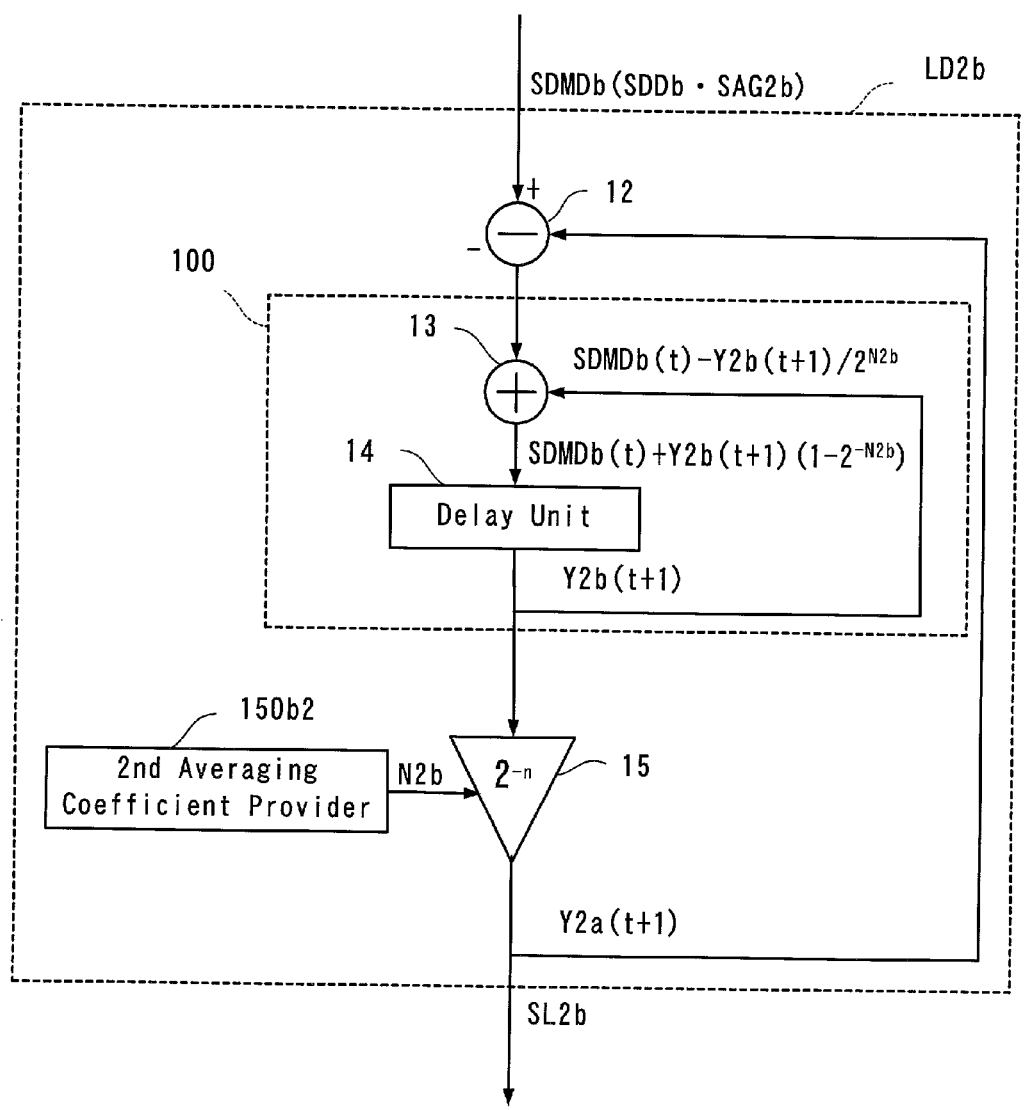
FIG. 10 is a block diagram showing the structure of a second level detector shown in FIG. 7.

In FIG. 10, the structure of the second level detector LD2b is shown. The second level detector LD2b is similar in structure to the second level detector LD2a shown in FIG. 4, except that a second averaging coefficient provider 150b2 is provided in place of the second averaging coefficient provider 150a2. As with the second averaging coefficient provider 150a2, the second averaging coefficient provider 150b2 outputs a second shift bit parameter N2b to the bit shifter 15.

In the present embodiment, the second automatic gain controller AGC2b has to follow frequency fluctuations under 300 Hz of the digital demodulated signal SDMDb whose frequency fluctuations under 100 Hz have been eliminated. Therefore, the second shift bit parameter N2b is set smaller than the first shift bit parameter N1a in the first AGC signal generator SG1a according to the above first embodiment. Note that, in the present embodiment, the second shift bit parameter N2b is preferably set to 8. The second shift pit parameter N2b is preferably set to the same value as to the first shift bit parameter N1b. In the present example, the first shift bit parameter N1b is set to 8 as the first shift bit parameter N1a.

Therefore, the second shift bit parameter N2b, the first shift bit parameter N1b, and the first shift bit parameter N1a in the digital broadcast receiving apparatus RPa according to the above first embodiment have a relation represented by the following equations (5) and (6).

$$N1a \geq N1b \quad (5)$$

$$N1a \geq N2b \quad (6)$$

Consequently, if the first shift bit parameter N2b is 8, the average value can be found by the second level detector LD2$b$ using $2^8$ (256) data values in a similar manner to that in the first level detector LD1$b$. Therefore, generated is a second level signal SL2$b$ followable to frequency fluctuations of the digital demodulated signal SDMDb to a degree achieved by the first automatic gain controller AGC1$b$ whose first shift bit parameter N1$a$ is 8.

Figure 11:
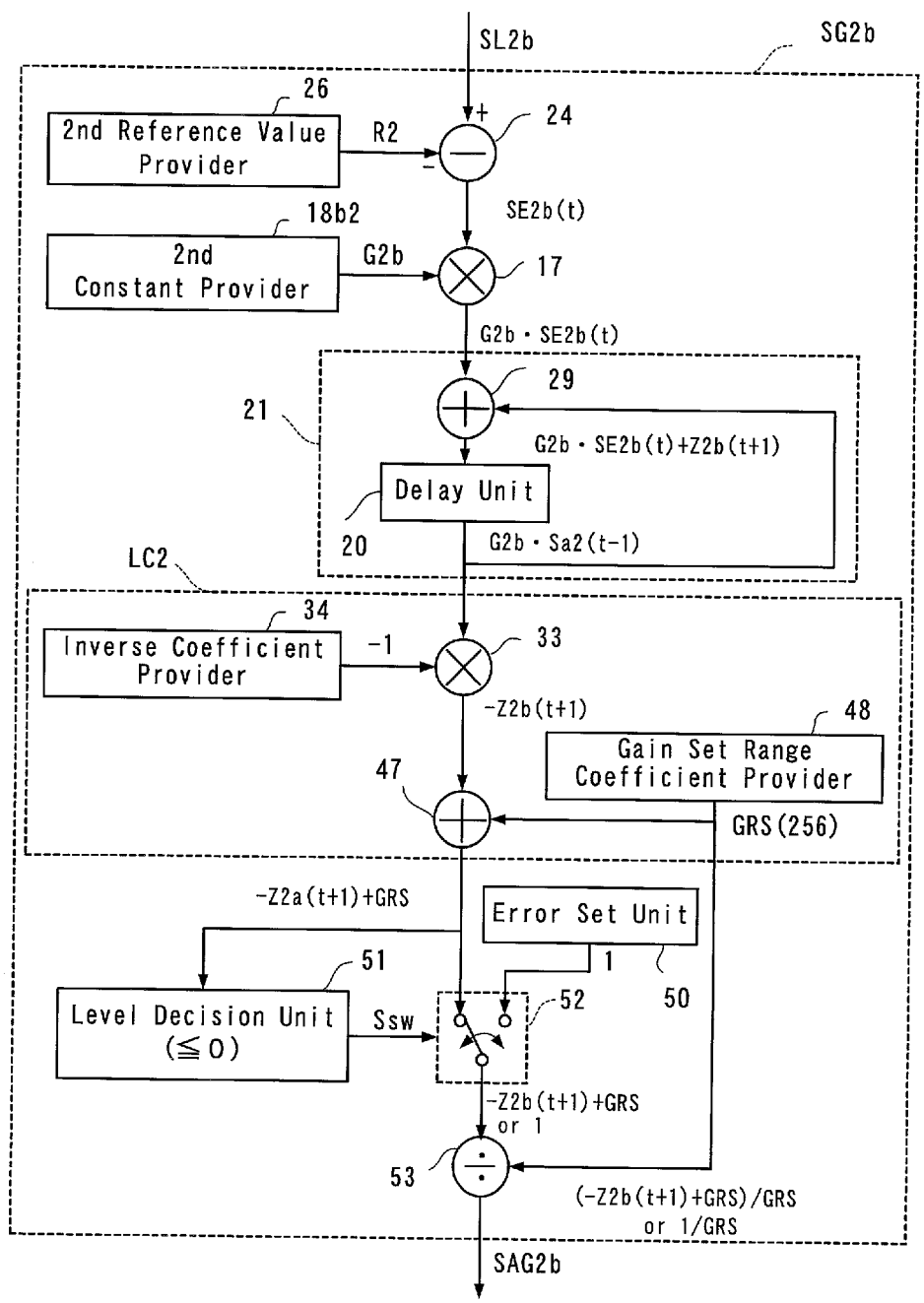
FIG. 11 is a block diagram showing the structure of a second AGC signal generator shown in FIG. 7.
Figure 12:
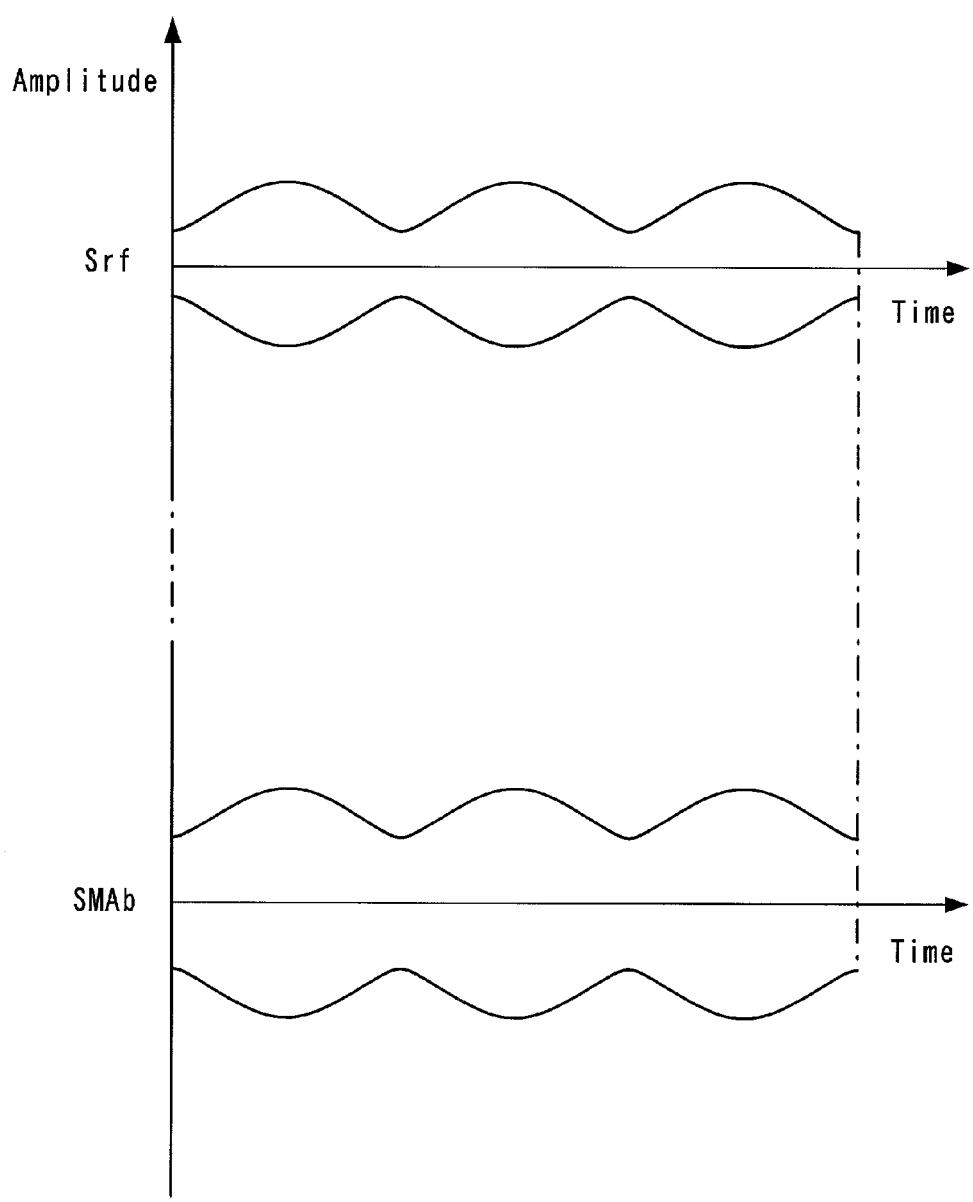
FIG. 12 is a diagram showing waveforms of a digital broadcast wave and a modulated analog signal observed in the digital broadcast receiving apparatus shown in FIG. 7.

In FIG. 11, the structure of the second AGC signal generator SG2$b$ is shown. The second AGC signal generator SG2$b$ is similar in structure to the second AGC signal generator SG2$a$ shown in FIG. 5, except that a second constant provider 18$b$2 is provided in place of the second constant provider 18$a$2. As with the first constant provider 18$b$1, the second constant provider 18$b$2 outputs a second constant G2$b$ to the multiplier 17.

In the present embodiment, the second automatic gain controller AGC2$b$ should follow frequency fluctuations under 300 Hz of the digital signal SDMDb whose frequency fluctuations under 100 Hz have been eliminated. Therefore, the second constant G2$b$ is set larger than the first constant G1$a$ and smaller than the second constant G2$a$ both in the first AGC signal generator SG1$a$ according to the above first embodiment. Alternatively, the second constant G2$b$ may be set larger than the first constant G1$a$ and the first constant G1$b$ in the first automatic gain controller AGC1$b$ according to the second embodiment. Preferably, the second constant G2$b$ is set to 16, as with the second constant G2$a$.

The second constant G2$b$, the first constant G1$b$, and the first and second constants G1$a$ and G2$a$ in the digital broadcast receiving apparatus RPa according to the above first embodiment have a relation represented by the following equations (7) and (8).

$$G1a < G1b < G2a \quad (7)$$

$$G1a < G1b < G2b \quad (8)$$

As stated above, the second shift bit parameter N2$b$ and the second constant G2$b$ are set to values more followable to frequency fluctuations of the digital SDMDb, compared with the first shift bit parameter N1$b$ and the first constant G1$b$ in the first automatic gain controller AGC1$b$. As a result, generated is a second gain control signal SAG2$b$ having a value more followable to high-frequency fluctuations than that of the first gain control signal SAG1$b$, and the second gain control signal SAG2$b$ is outputted to the multiplier 8. Therefore, frequency fluctuations of 100 Hz to 300 Hz that have not yet been eliminated by the first automatic gain controller AGC1$b$ can be eliminated.

In the present embodiment, when the frequency-fluctuating digital broadcast wave Srf is supplied to the tuner 2, a relatively small number of data values, 128 (N1$b$ =7) values, for example, are used for level detection by the bit shifter 15 of the first level detector LD1$b$. On the other hand, the first constant G1$b$ of the first AGC signal generator SG1$b$ is set relatively large (8, for example). Consequently, as can be seen from the digital broadcast wave Srf and the modulated analog signal SMA$b$ shown in FIG. 12, the first automatic gain controller AGC1$b$ controls only the level of the whole signal to a predetermined value, and follows the frequency-fluctuating signal as much as possible.

Then, a relatively small number of data values, 128 (N2$b$=7) values, for example, are used for level detection by the bit shifter 15 of the second level detector LD2$b$. On the other hand, the second constant G2$b$ of the second AGC signal generator SG2$b$ is set relatively large (8, for example), thereby enabling the second automatic gain controller AGC2$b$ to follow the remaining frequency and amplitude fluctuations that have not yet been eliminated by the first automatic gain controller AGC1$b$.

In other words, in the present embodiment, frequency and amplitude fluctuations of the frequency-fluctuating signal are followed as much as possible for reduction by the first automatic gain controller AGC1$b$, and then the remaining fluctuations are followed by the second automatic gain controller AGC2$b$. In the conventional structure, only the frequency fluctuations under 100 Hz can be followed. In the present embodiment, however, two automatic gain controllers are provided: the first automatic gain controller for controlling the tuner 2 and the second automatic gain controller for digital control. For each automatic gain controller, parameters are selected to follow frequency fluctuations. Therefore, frequency fluctuations of up to 300 Hz can be followed if the digital broadcast wave Srf at the C/N ratio under 17 dB.

Third Embodiment

Figure 16:
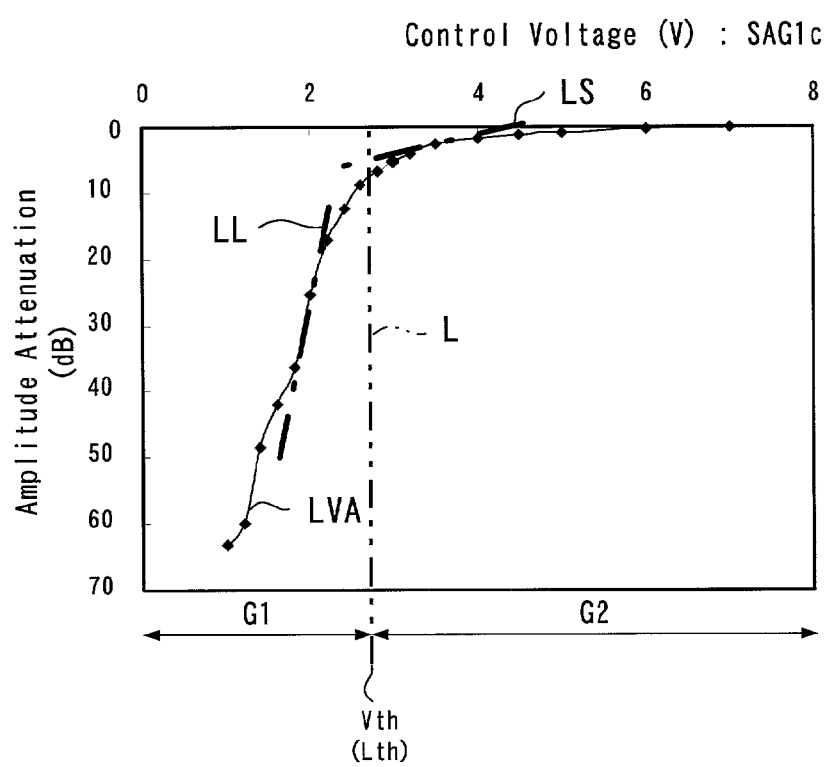
FIG. 16 is a diagram showing a control-voltage to amplitude-attenuation characteristic and a threshold voltage of a tuner in the digital broadcast receiving apparatus shown in FIG. 13.

Described below is the digital broadcast receiving apparatus according to the third embodiment of the present invention exemplarily applied to receive a digital broadcast wave. Prior to that, with reference to FIG. 16, the basic concept of the present embodiment is first described. In FIG. 16, a control-voltage to amplitude-attenuation characteristic of the tuner 2 is illustrated. In FIG. 16, the lateral axis represents a control voltage of the tuner 2, and the vertical axis represents the amplitude attenuation of the tuner 2 with respect to the control voltage. A solid line LVA represents the control-voltage to amplitude-attenuation characteristic. As can be seen from the drawing, the characteristic is abruptly and significantly changed at a predetermined control voltage (in the present example, in the vicinity of approximately 2.4V).

Such control voltage at which the control-voltage to amplitude-attenuation characteristic LVA is significantly changed is hereinafter referred to as a threshold voltage Vth, and represented by a two-dotted line L. That is, the tilt of the control-voltage to amplitude-attenuation characteristic LVA is significantly changed in the vicinity of the threshold voltage Vth. For better readability, the tilt of the control-voltage to amplitude-attenuation characteristic LVA in control voltages higher than the threshold voltage Vth is approximated by a one-dotted line LS, while the tilt thereof in control voltages lower than the threshold voltage Vth is by a one-dotted line LL.

As can be seen from the drawing, the tilt of the control-voltage to amplitude-attenuation characteristic LVA is significantly changed at the threshold voltage Vth. Therefore, in the digital broadcast receiving apparatus RPb according to the above second embodiment, the gain of the loop formed between the tuner 2 and the first automatic gain controller AGC1$b$ is varied depending on whether the first level signal SL1$b$ detected by the first level detector LD1$b$ is at the voltage lower than the threshold voltage Vth or not.

When the digital broadcast wave Srf fluctuates in frequency, large gain of the loop formed between the tuner 2 and the first automatic gain controller AGC1$b$ enables frequency fluctuations up to 180 Hz to be followed if the value detected by the first level detector LD1$b$ (first level signal SL1$b$) is at a voltage lower than the threshold voltage Vth. On the other hand, if the value is at a voltage equal to or higher than the threshold voltage Vth, only frequency fluctuations up to 150 Hz can be followed, which has been experimentally confirmed.

In this respect, the first constant G1$b$ can preferably be switched to enable the digital broadcast receiving apparatus to follow frequency fluctuations up to 300 Hz even if the digital broadcast wave Srf fluctuates in level. With such switching, the gain of the loop formed between the tuner 2 and the first automatic gain controller AGC1$c$ can be made constant to some extent. For this purpose, two constants, that is, a small constant G1 and a large constant G2, are provided. The small constant G1 is suitable when the level of the digital broadcast wave Srf is at a voltage lower than the threshold voltage. The large constant G2 is suitable when the level thereof is at a voltage equal to or higher than the threshold voltage. In accordance with the level of the digital broadcast wave Srf, either one of these two constants G1 and G2 is selected for use as the first constant G1$b$, thereby switching the loop gain between the first automatic gain controller AGC1$b$ and the tuner 2. As such, the digital receiving apparatus suggested herein can always give high performances when receiving the frequency-fluctuating digital broadcast wave RF, irrespectively of the level of the digital broadcast wave Srf supplied to the tuner 2.

Figure 13:
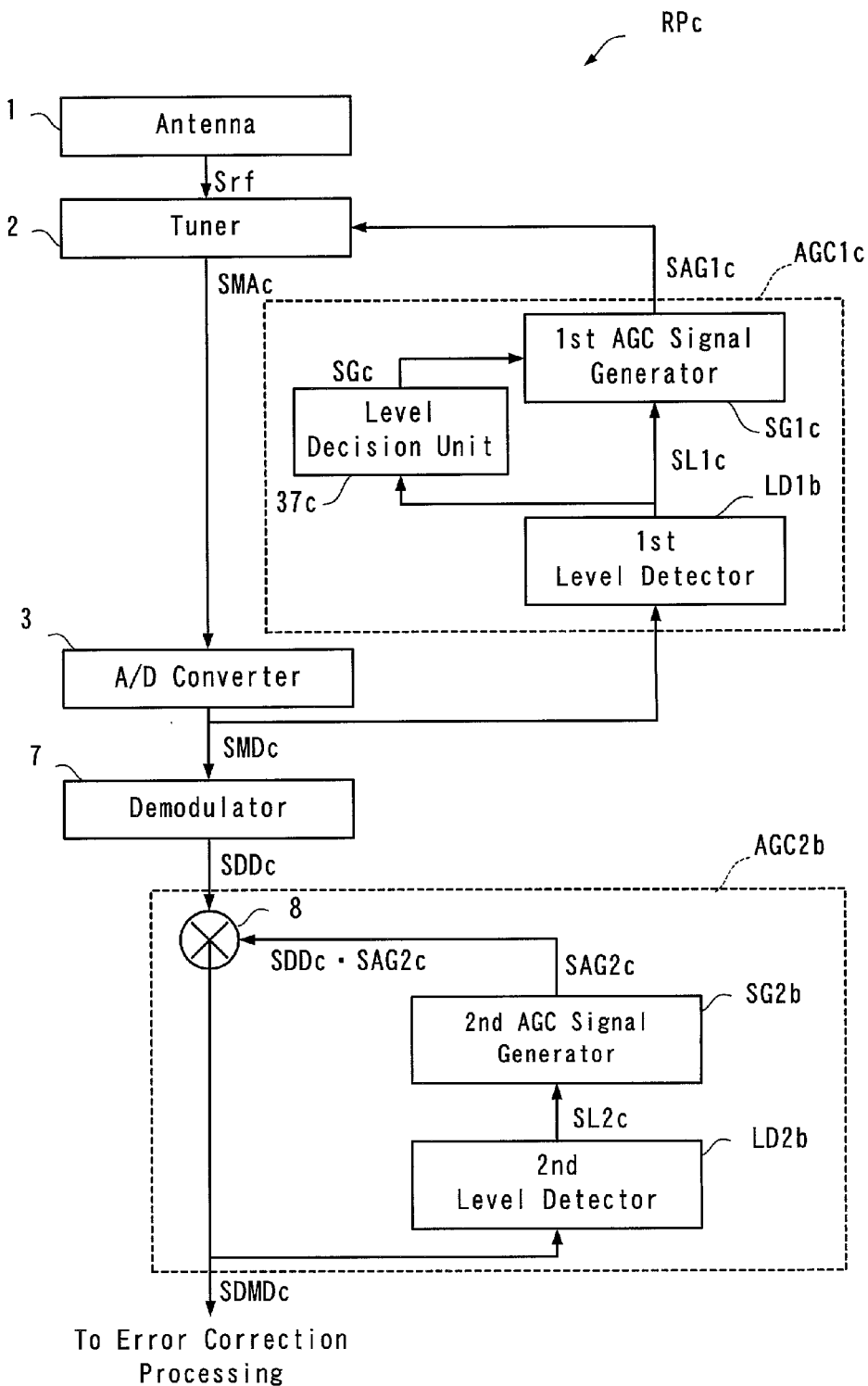
FIG. 13 is a block diagram showing the structure of a digital broadcast receiving apparatus according to a third embodiment of the present invention.

With reference to FIG. 13, the digital broadcast receiving apparatus RP$c$ according to the present embodiment is described. The digital broadcast receiving apparatus RP$c$ is similar in structure to the digital broadcast receiving apparatus RP$b$ shown in FIG. 7, except that a first automatic gain controller AGC1$c$ is provided in place of the first automatic gain controller AGC1$b$. To the first automatic gain controller AGC1$c$, a first AGC signal generator SG1$c$ is provided in place of the first AGC signal generator SG1$b$ according to the second embodiment. Moreover, a level decision unit 37$c$ is additionally provided to connect the first AGC signal generator SG1$c$ and the first level detector LD1$b$.

Mainly described below are features unique to the present embodiment. In the drawings, each component, signal and parameter unique to the present embodiment is represented and identified by a reference character with the suffix "c" added thereto. The same components and operations as those of the above first and second embodiments are not described herein.

The level decision unit 37$c$ outputs, to the first AGC signal generator SG1$c$, a control signal SGc having a binary value indicative of either 0 or 1, based on a first level signal SL1$c$ outputted from the first level detector LD1$b$.

Figure 14:
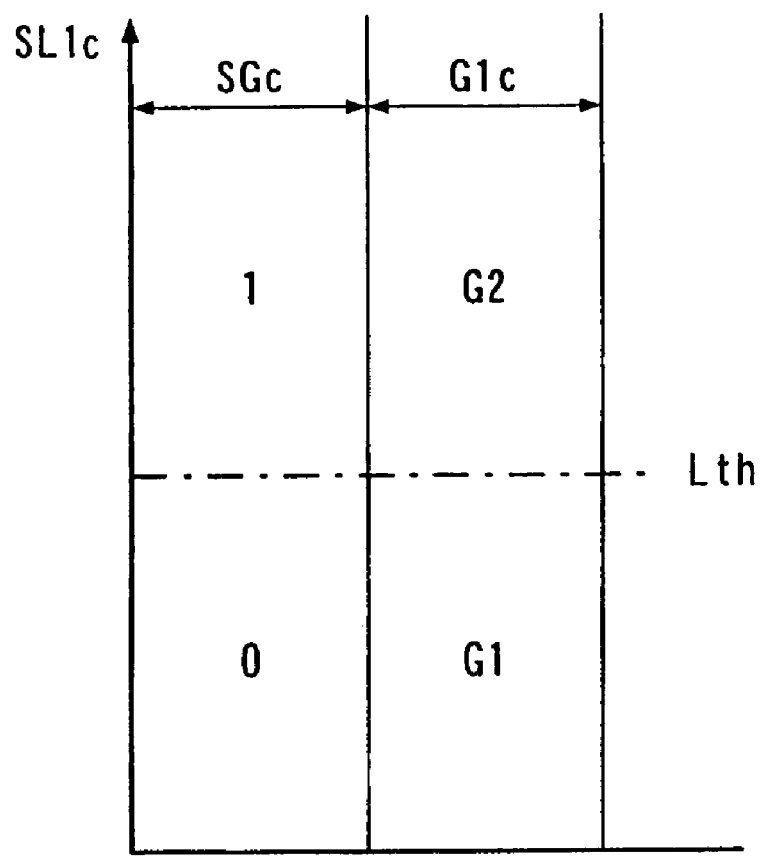
FIG. 14 is a diagram demonstrating the operation of a level decision unit shown in FIG. 13 for switching a first constant based on a first level signal.

With reference to FIG. 14, the operation of the level decision unit 37$c$ is briefly described. In FIG. 14, the vertical axis represents the first level signal SL1$c$ outputted from the first level detector LD1$b$, while the lateral axis represents constant values corresponding to the control signal SGC and a first constant G1$c$. Specifically, the level decision unit 37$c$ compares the level of first level signal SL1$c$ with a threshold Lth. If the level is equal to or higher than the threshold Lth, the level decision unit 37$c$ outputs the control signal SGc indicative of "1", and otherwise outputs the one indicative of "0". To the values of the control signal SGc, the small constant G1 and the large constant G2 are correspondingly related for determining the loop gain between the tuner 2 and the first automatic gain controller AGC1$c$. In the present embodiment, the value "0" of the control signal SGc corresponds to the small constant G1, while the value "1" thereof corresponds to the large constant G2. These correspondences are further described below in relation to the structure of the first AGC signal generator SG1$c$.

Figure 15:
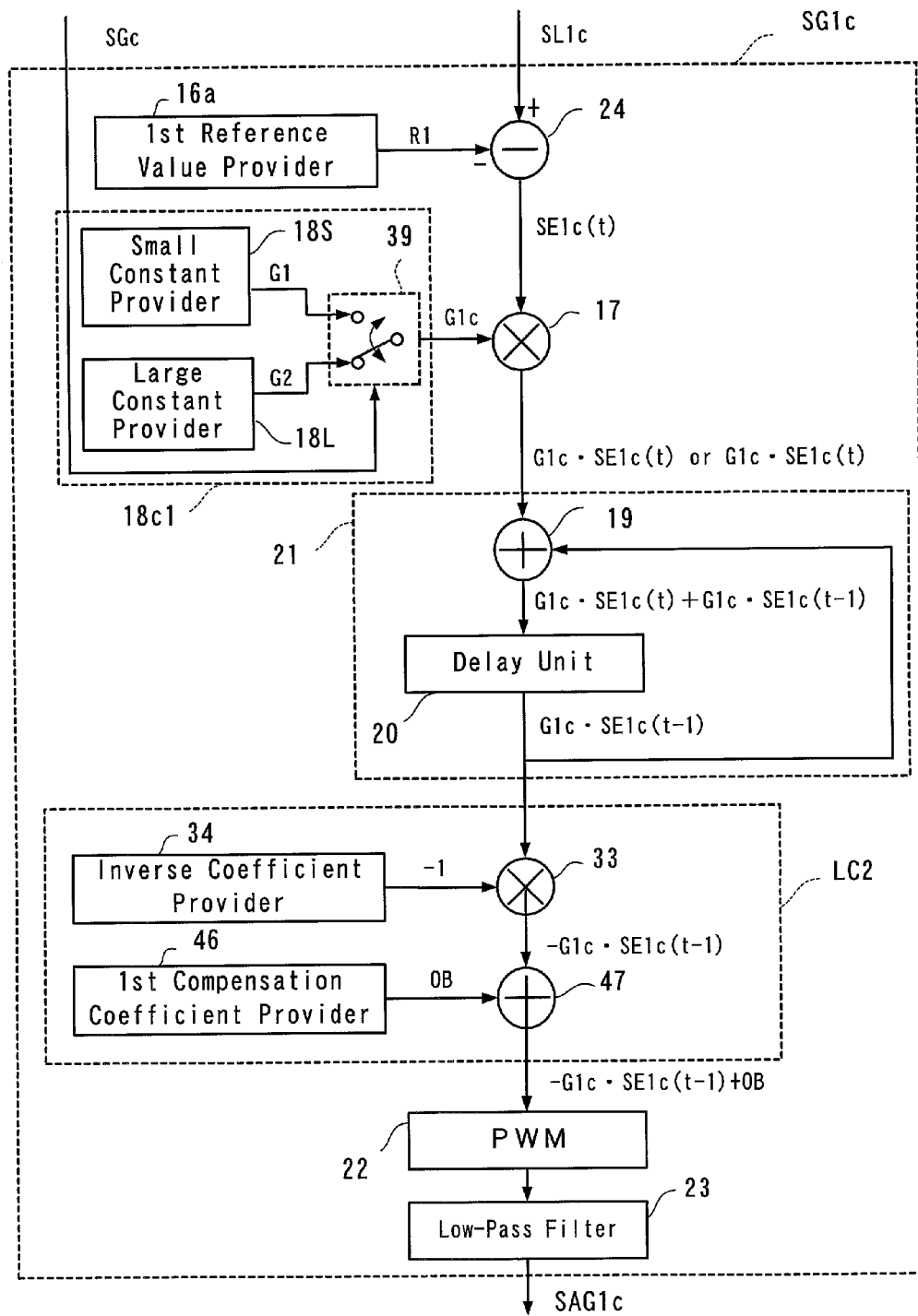
FIG. 15 is a block diagram showing the structure of a first AGC signal generator shown in FIG. 13.

In FIG. 15, the structure of the first AGC signal generator SG1$c$ is illustrated in detail. The first AGC signal generator SG1$c$ is similar in structure to the first AGC signal generator SG1$b$ shown in FIG. 9, except that an adaptive constant switch 18$c$1 is provided in place of the first constant provider 18$b$1. The adaptive constant switch 18$c$1 includes a small constant provider 18S, a large constant provider 18L, and a switch 39. The small constant provider 18S and the large constant provider 18L output the small constant G1 and the large constant G2, respectively, as described with reference to FIGS. 14 and 16.

The switch 39 is connected to an output port of the small constant provider 18S, an output port of the large constant provider 18L, an output port of the level decision unit 37$c$, and an input port of the multiplier 17. Based on the control signal SGc received from the level decision unit 37$c$, the switch 39 selects either one output port of the small constant provider 18S or the large constant provider 18L for connection to the input port of the multiplier 17. As a result, the multiplier 17 is provided with, as a first constant G1$c$, the small constant G1 by the small constant provider 18S or the large constant G2 by the large constant provider 18L. As such, instead of the first constant G1$b$ in the first AGC signal generator SG1$b$ of the digital broadcast receiving apparatus RP$b$ according to the second embodiment, the first constant G1$c$ having either one of two values according to the level of the first level signal SL1$c$ is outputted. Thus, the gain of the loop formed between the tuner 2 and the first automatic gain controller AGC1$c$ is adaptively adjusted according to the level of the first level signal SL1$c$.

Fourth Embodiment

Figure 20:
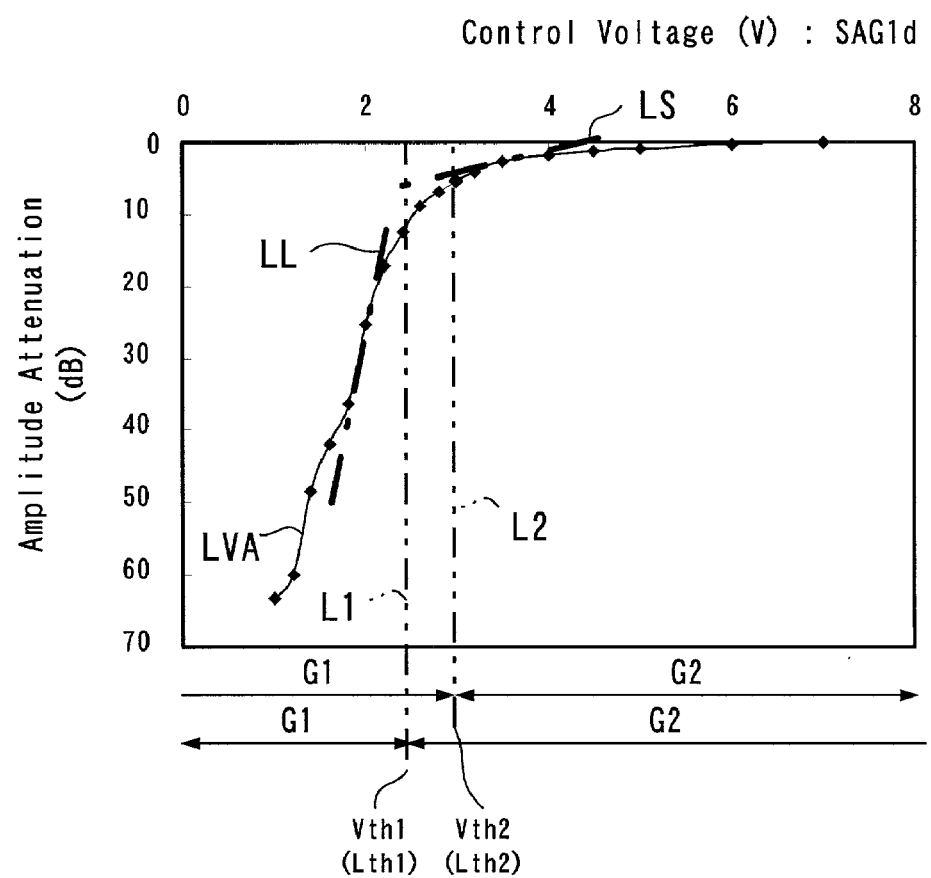
FIG. 20 is a diagram showing a control-voltage to amplitude-attenuation characteristic and first and second threshold voltages of a tuner in the digital broadcast receiving apparatus shown in FIG. 17.
Figure 21:
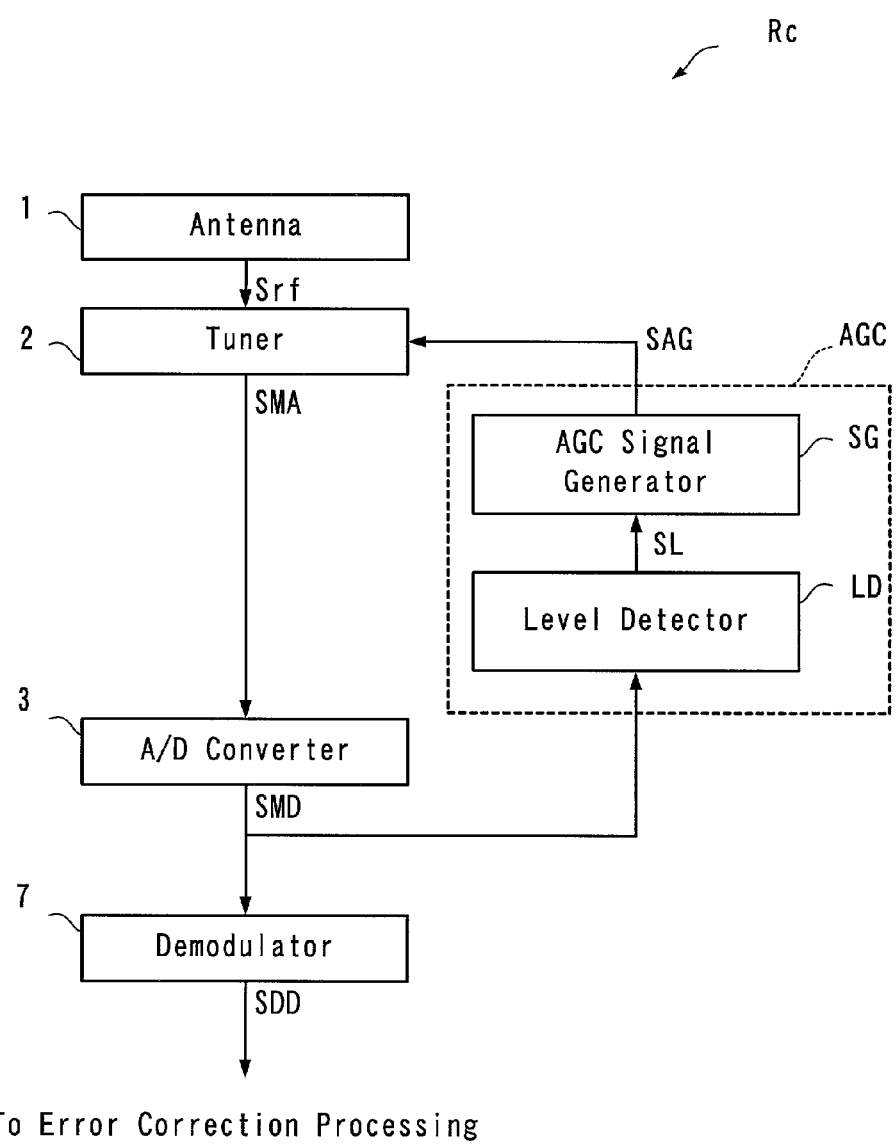
FIG. 21 is a block diagram showing the structure of a conventional digital broadcast receiving apparatus.
Figure 22:
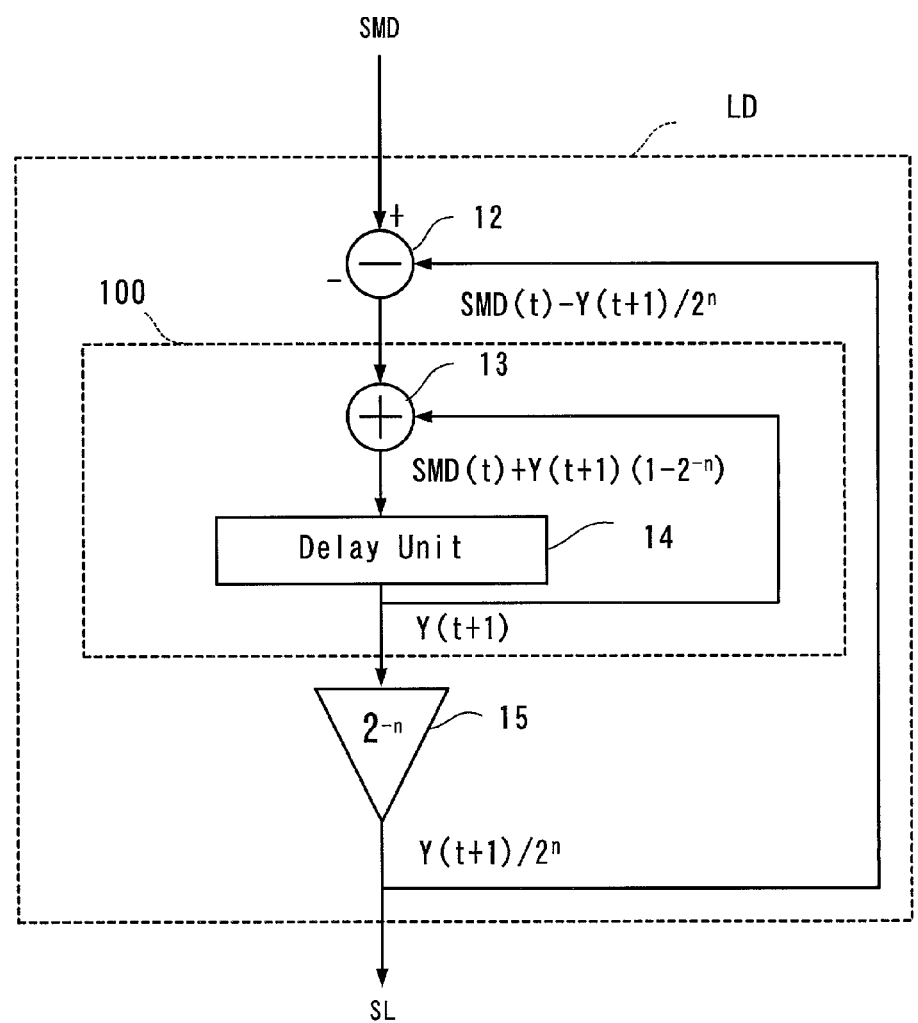
FIG. 22 is a block diagram showing the structure of a level detector shown in FIG. 21.
Figure 23:
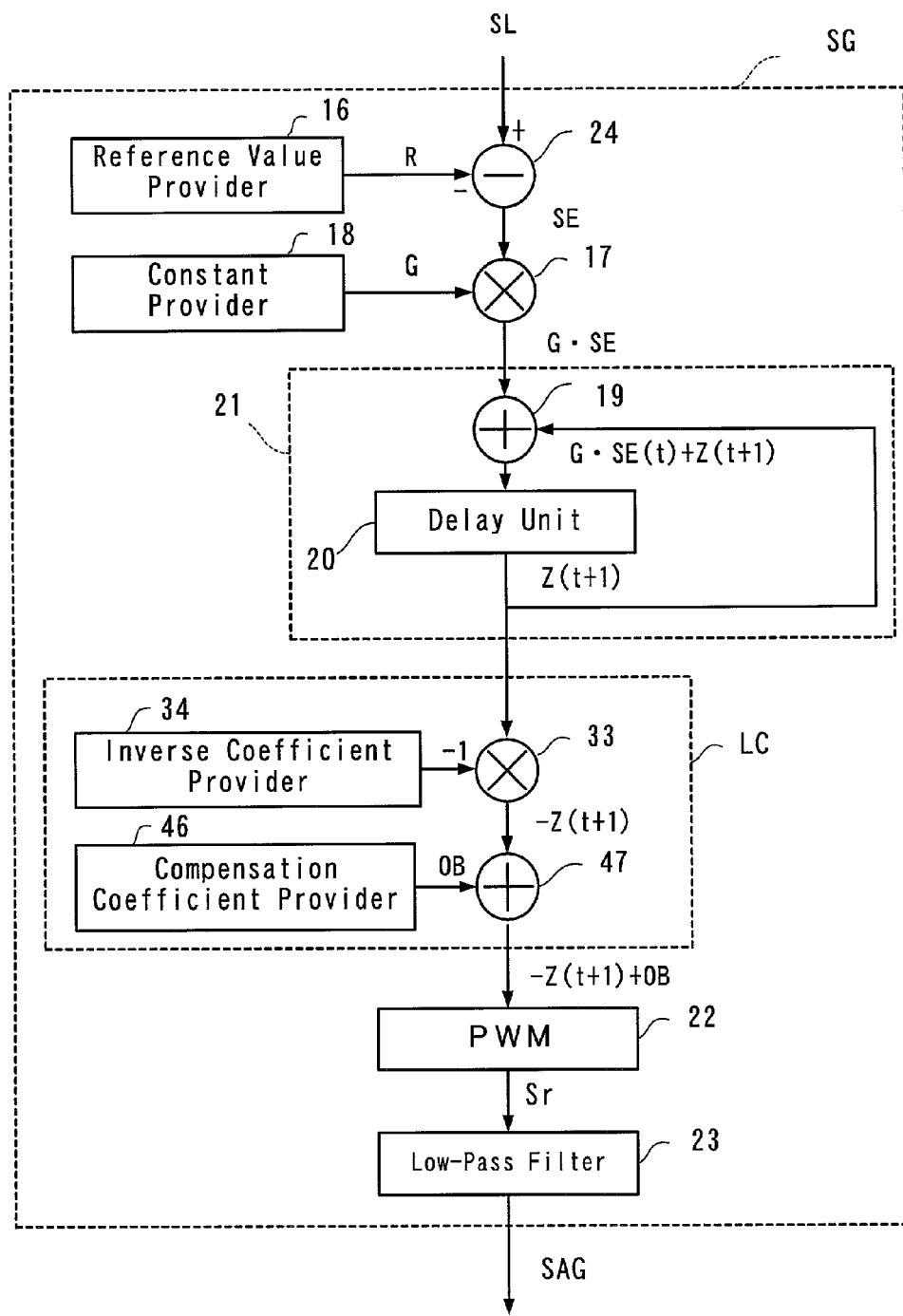
FIG. 23 is a block diagram showing the structure of an AGC signal generator shown in FIG. 21.
Figure 24:
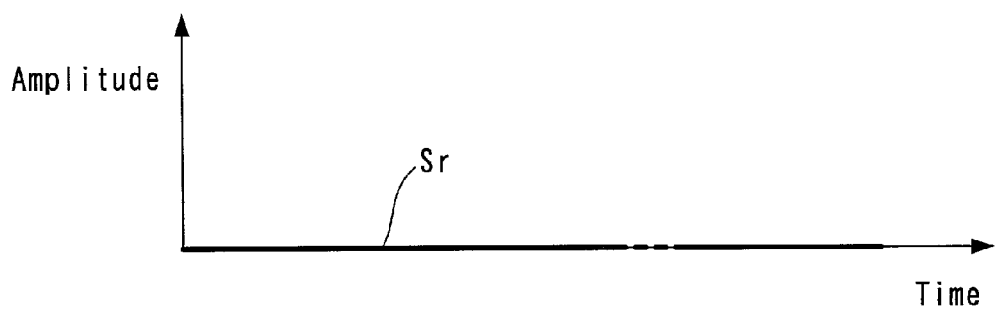
FIG. 24 is a schematic diagram showing a square-wave signal when the value of a digital broadcast wave is at maximum and the value of a level signal is also at maximum in the digital broadcast receiving apparatus shown in FIG. 21.
Figure 25:
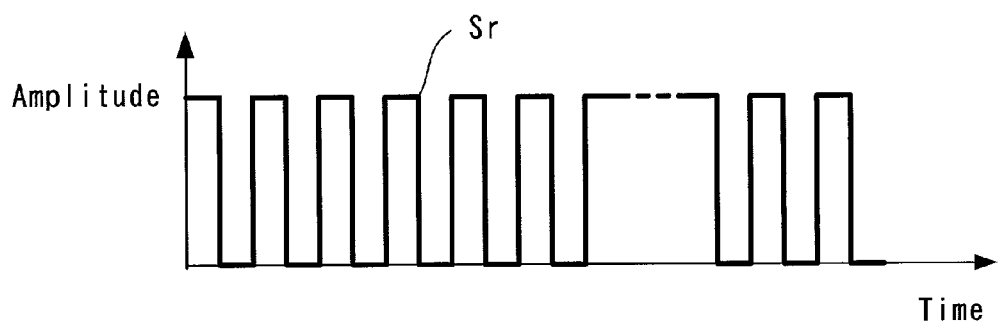
FIG. 25 is a schematic diagram showing a square-wave signal when the value of the digital broadcast wave is at medium and the value of the level signal is also at medium in the digital broadcast receiving apparatus shown in FIG. 21.
Figure 26:
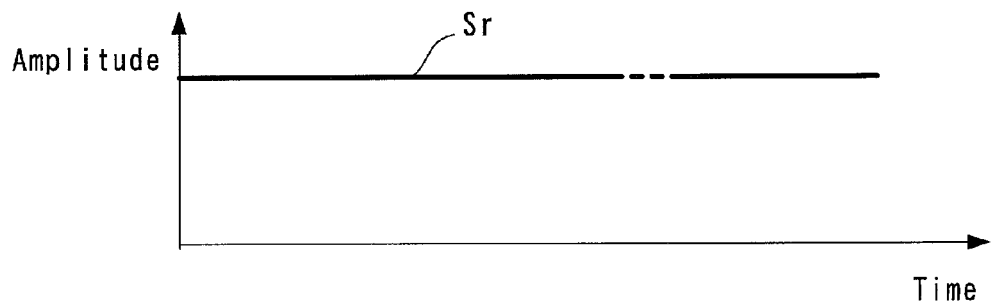
FIG. 26 is a schematic diagram showing a square-wave signal when the value of the digital broadcast wave is at minimum and the value of the level signal is also at minimum in the digital broadcast receiving apparatus shown in FIG. 21.
Figure 27:
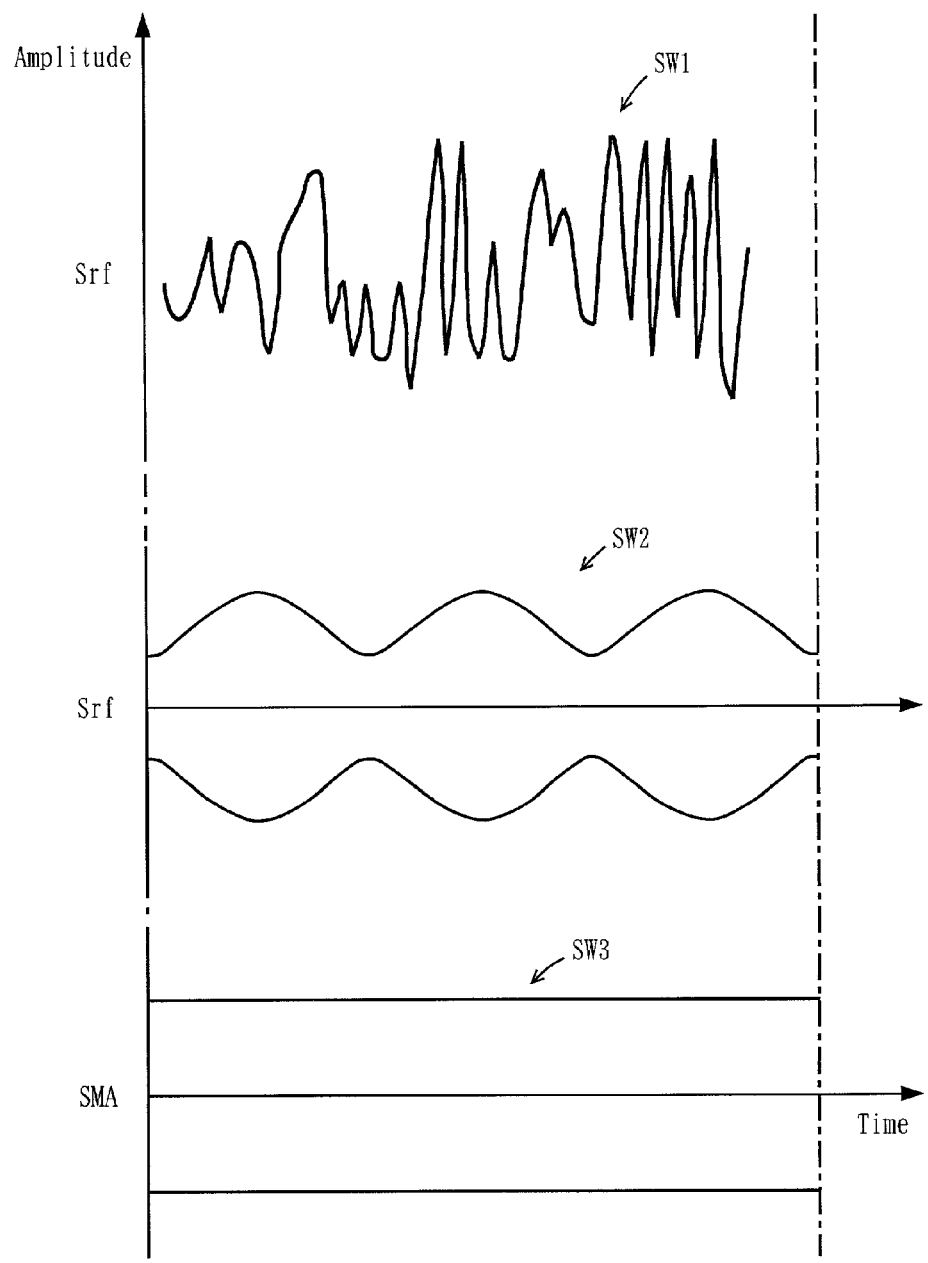
FIG. 27 is a schematic diagram showing the relation between the digital broadcast wave and a modulated analog signal in the digital broadcast receiving apparatus shown in FIG. 21.

Described below is the digital broadcast receiving apparatus according to the fourth embodiment of the present invention exemplarily applied to receive a digital broadcast wave. Prior to that, with reference to FIGS. 16 and 20, the basic concept of the present embodiment is first described. FIG. 20 is similar to FIG. 16, except that the threshold voltage Vth represented by the two-dotted line L in FIG. 16 is replaced with a first threshold voltage Vth1 represented by a two-dotted line L1 and a second threshold voltage Vth2 represented by a two-dotted line L2 (Vth1<Vth2).

In the digital broadcast receiving apparatus RP$c$ according to the above third embodiment, in consideration of the control-voltage to amplitude-attenuation characteristic shown in FIG. 16, the first constant G1$c$ is switched between the small constant G1 and the large constant G2 based on whether the value of the first level signal SL1$c$ is at a voltage larger than the single threshold voltage Vth. However, since the digital broadcast wave Srf is always somewhat fluctuating, the level of the first level signal SL1$c$ is also always fluctuating.

Therefore, if the level of the first level signal SL1$c$ fluctuates in some range centering at the threshold voltage Vth, the small constant G1 and the large constant G2 are frequently switched in accordance with the fluctuations. As stated above, there is a large difference in value between the small constant G1 and the large constant G2. Therefore, even slight fluctuations of the first level signal SL1 cause frequent, wild changes in the first constant G1$c$, that is, jittering. With this, the first automatic gain controller AGC1$c$ becomes unstable in gain adjustment operation and, in turn, the quality of the demodulated digital signal SDMDc deteriorates.

In this respect, level fluctuations of the first level signal SL1 is detected using not the single threshold voltage Vth but the first and second threshold voltages Vth1 and Vth2. Thus, jitter caused in the first constant G1$c$ by slight fluctuations of the first level signal SL1$c$ can be prevented. In other words, a region between the first and second voltage thresholds Vth1 and Vth2 does not uniquely correspond to a fluctuation of the first level signal, but serves as a buffer region, where the first constant G1c switches differently according to the pattern of fluctuations of the first level signal SL1c.

Figure 17:
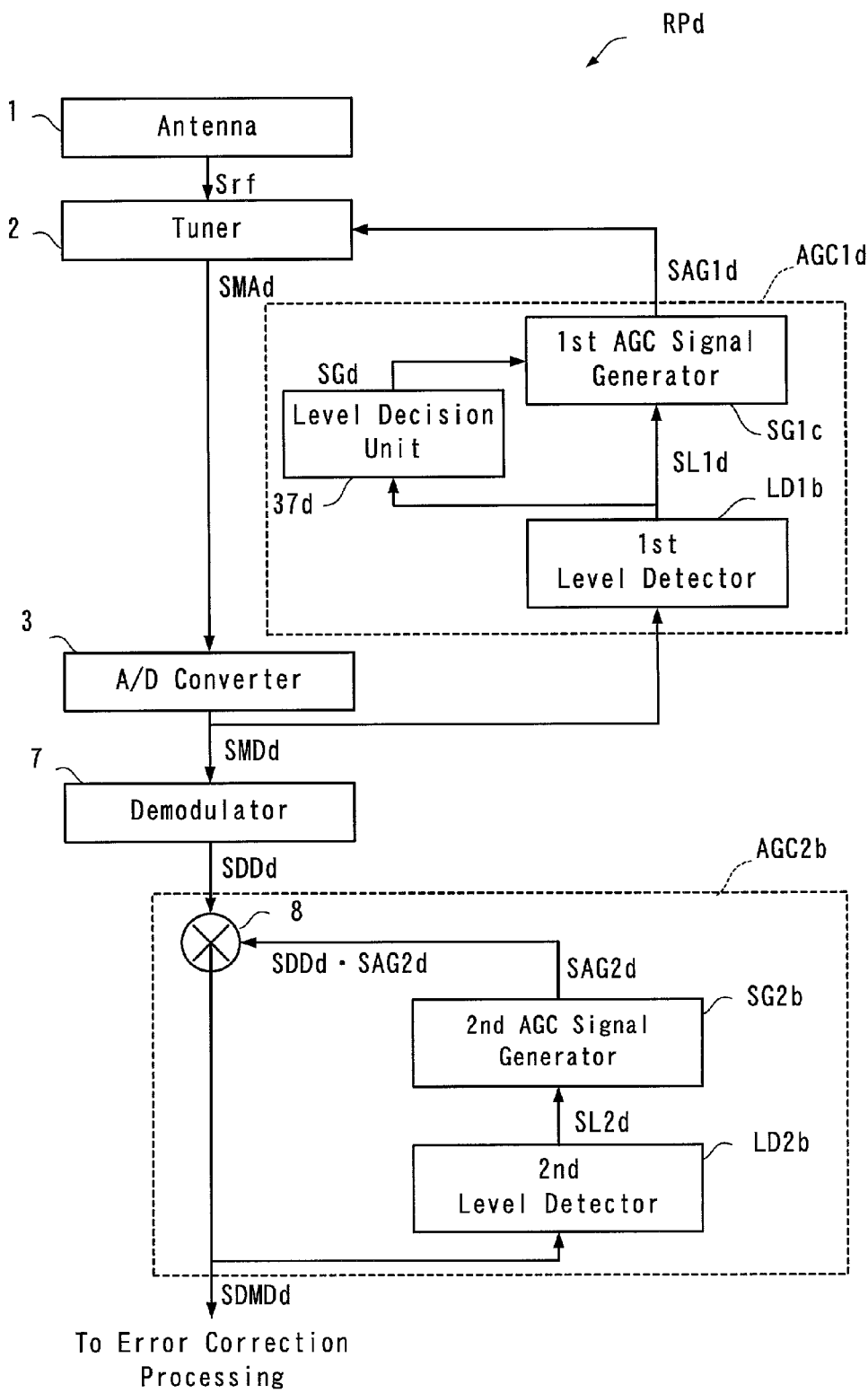
FIG. 17 is a block diagram showing the structure of a digital broadcast receiving apparatus according to a fourth embodiment of the present invention.

As shown in FIG. 17, a digital broadcast receiving apparatus RPd according to the present embodiment is similar in structure to the digital broadcast receiving apparatus RPco according to the third embodiment shown in FIG. 13, except that a level decision unit 37d is provided in place of the level decision unit 37c.

Mainly described below are features unique to the present embodiment. In the drawings, each component, signal and parameter unique to the present embodiment is represented and identified by a reference character with the suffix "d" added thereto. The same components and operations as those of the above first to third embodiments are not described herein.

Figure 18:
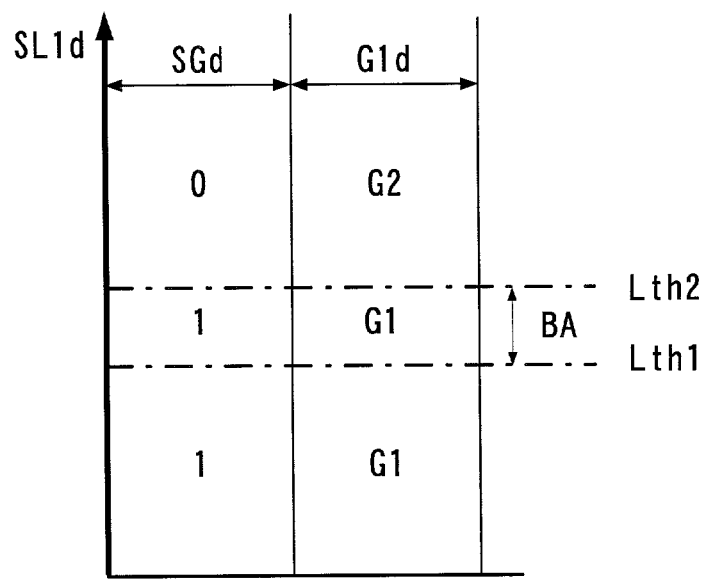
FIG. 18 is a diagram demonstrating the operation of the a level decision unit shown in FIG. 17 for switching a first constant when a first level signal is increased.
Figure 19:
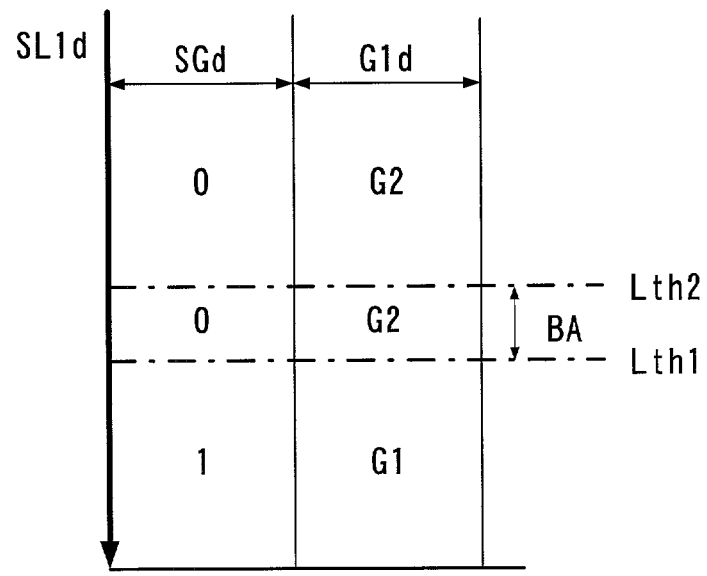
FIG. 19 is a diagram demonstrating the operation of the level decision unit shown in FIG. 17 for switching a first constant when a first level signal is decreased.

With reference to FIGS. 18 and 19, the level decision unit 37d is described. The level decision unit 37d is similar in structure to the level decision unit 37c already described with reference to FIG. 14. However, in the level decision unit 37d, a first threshold Lth1 and a second threshold Lth2 are provided (Lth1<Lth2) instead of the threshold Lth. Between these first and second thresholds Lth1 and Lth2, a buffer region BA is provided for assigning 0 or 1 as a control signal SGd according to the fluctuations of a first level signal SL1d.

With reference to FIGS. 18 and 19, described below are changes in the control signal SGd and the first constant G1d with respect to the changes in the first level signal SL1d.

Described below are two examples. Now, a first example is described. Firstly, as shown in FIG. 18, when the first level signal SL1d is at a level lower than the second threshold Lth2, the value of the control signal SGd is set to 1, and the small constant G1 is outputted as the first constant G1d. Then, when the first level signal SL1d becomes higher in level than the second threshold Lth2, also as shown in FIG. 18, the value of control signal SGd is switched to 0, and the large constant G2 is outputted as the first constant G1d. Then, when the first level signal SL1d becomes lower in level than the second threshold Lth2 and higher than the first threshold Lth1, as shown in FIG. 19, the value of the control signal SGd remains 0, and the large constant G2 is outputted as the first constant G1d. Then, when the first level signal SL1d becomes lower in level than the first threshold Lth1, also as shown in FIG. 19, the value of the control signal SGd is switched to 1, and the small constant G1 is outputted as the first constant G1d. Then, when the first level signal SL1d becomes lower in level than the second threshold Lth2 and higher than the first threshold Lth1, referring back to FIG. 18, the value of the control signal SGd remains 1, and the small constant G1 is outputted as the first constant G1d. Lastly, when the first level signal SL1d becomes higher in level than the second threshold Lth2, also as shown in FIG. 18, the value of the control signal SGd is switched to 0, and the large constant G2 is outputted as the first constant G1d.

Next, a second example is described. Firstly, as shown in FIG. 19, when the first level signal SL1d is at a level higher than the second threshold Lth2, the value of the control signal SGd is set to 0, and the large constant G2 is outputted as the first constant G1d. Then, when the first level signal SL1d becomes lower in level than the second threshold Lth2 and higher than the first threshold Lth1, also as shown in FIG. 19, the value of control signal SGd remains 0, and the large constant G2 is outputted as the first constant G1d. Then, when the first level signal SL1d becomes lower in level than the first threshold Lth1, as shown in FIG. 19, the value of the control signal SGd is switched to 1, and the small constant G1 is outputted as the first constant G1d. Then, when the first level signal SL1d becomes lower in level than the second threshold Lth2 and higher than the first threshold Lth1, as shown in FIG. 18, the value of the control signal SGd remains 1, and the small constant G1 is outputted as the first constant G1d. Lastly, when the first level signal SL1d becomes higher in level than the second threshold Lth2, as shown in FIG. 18, the value of the control signal SGd is switched to 0, and the large constant G2 is outputted as the first constant G1d.

An alternative explanation is made for the above first example with reference to changes in control voltage shown in FIG. 20. Firstly, when the control voltage SAG1d is lower than the second threshold voltage Vth2, the value of the control signal SGd is set to 1, and the small constant G1 is outputted as the first constant G1d. Then, when the control voltage SAG1d becomes higher than the second voltage Vth2, the value of control signal SGd is switched to 0, and the large constant G2 is outputted as the first constant G1d. Then, when the control voltage SAG1d becomes lower than the second threshold voltage Vth2 and higher than the first threshold voltage Vth1, the value of the control signal SGd remains 0, and the large constant G2 is outputted as the first constant G1d. Then, when the control voltage SAG1d becomes lower than the first threshold voltage Vth1, the value of the control signal SGd is switched to 1, and the small constant G1 is outputted as the first constant G1d. Then, when the control voltage SAG1d becomes lower than the second threshold voltage Vth2 and higher than the first threshold voltage Vth1, the value of the control signal SGd remains 1, and the small constant G1 is. outputted as the first constant G1d. Lastly, when the control voltage SAG1d becomes higher than the second threshold voltage Vth2, the value of the control signal SGd is switched to 0, and the large constant G2 is outputted as the first constant G1d. An alternative explanation is made for the above first example with reference to changes in control voltage shown in FIG. 20. Firstly, when the control voltage SAG1d is lower than the second threshold voltage Vth2, the value of the control signal SGd is set to 1, and the small constant G1 is outputted as the first constant G1d. Then, when the control voltage SAG1d becomes higher than the second threshold voltage Vth2, the value of control signal SGd is switched to 0, and the large constant G2 is outputted as the first constant G1d. Then, when the control voltage SAG1d becomes lower than the second threshold voltage Vth2 and higher than the first threshold voltage Vth1, the value of the control signal SGd remains 0, and the large constant G2 is outputted as the first constant G1d. Then, when the control voltage SAG1d becomes lower than the first threshold voltage Vth1, the value of the control signal SGd is switched to 1, and the small constant G1 is outputted as the first constant G1d. Then, when the control voltage SAG1d becomes lower than the second threshold voltage Vth2 and higher than the first threshold voltage Vth1, the value of the control signal SGd remains 1, and the small constant G1 is outputted as the first constant G1d. Lastly, when the control voltage SAG1d becomes higher than the second threshold voltage Vth2, the value of the control signal SGd is switched to 0, and the large constant G2 is outputted as the first constant G1d.

An alternative explanation is made for the above second example with reference to changes in control voltage shown in FIG. 20. Firstly, when the control voltage SAG1d becomes higher than the second threshold voltage Vth2, the value of the control signal SGd is set to 0, and the large constant G2 is outputted as the first constant G1d. Then, when the control voltage SAG1d becomes lower than the second threshold voltage Vth2 and higher than the first threshold voltage Vth1, the value of control signal SGd remains 0, and the large constant G2 is outputted as the first constant G1d. Then, when the control voltage SAG1d becomes lower than the first threshold voltage Vth1, the value of the control signal SGd is switched to 1, and the small constant G1 is outputted as the first constant G1d. Then, when the control voltage SAG1d becomes lower than the second threshold voltage Vth2 and higher than the first threshold voltage Vth1, the value of the control signal SGd remains 1, and the small constant G1 is outputted as the first constant G1d. Finally, when the control voltage SAG1d becomes higher than the second threshold voltage Vth2, the value of the control signal SGd is switched to 0, and the large constant G2 is outputted as the first constant G1d.

As such, a buffer region is provided between the first and second threshold voltages Vth1 and Vth2. This provides hysteresis for preventing the first constant G1d, which determines the loop gain between the tuner 2 and the first automatic gain controller AGC1d, from being frequently switched between the small constant G1 and the large constant G2.

While the invention has been described in detail, the foregoing description is in all aspects illustrative and not restrictive. It is understood that numerous other modifications and variations can be devised without departing from the scope of the invention.

What is claimed is:

1. A digital broadcast receiving apparatus for amplifying a digital modulated signal wave propagated through air with gain automatically adjusted to have a predetermined amplitude, and demodulating the digital modulated signal wave to a digital signal, the digital broadcast receiving apparatus comprising:
    tuner means for frequency-converting the digital modulated signal wave into a first modulated signal;
    first automatic gain control amplification means for controlling gain of said tuner means to make a level of the first modulated signal at a first predetermined level;
    A/D conversion means for converting, analog to digital, the first modulated signal into a second modulated signal;
    demodulation means for demodulating the second modulated signal into a first demodulated digital signal; and
    second automatic gain control amplification means for amplifying a level of the first demodulated digital signal by following frequency fluctuations thereof to be at a second predetermined level, and generating a second demodulated digital signal, wherein
    said first automatic gain control amplification means controls amplification of the digital modulated signal wave by following frequency fluctuations thereof that are smaller than a first predetermined frequency for generation of the first modulated signal, and said second automatic gain control amplification means amplifies the first demodulated digital signal by following frequency fluctuations thereof under a second predetermined frequency that is larger than the first predetermined frequency, and generates the second demodulated digital signal.

2. The digital broadcast receiving apparatus according to claim 1, wherein the first automatic gain control amplification means comprises:
    level detection means for detecting a level of the second modulated signal; and
    gain change means for changing the gain of said tuner means based on the detected level.

3. The digital broadcast receiving apparatus according to claim 2, wherein
    said gain change means uses, as the gain, a first predetermined value when the detected level is higher than a threshold, and a second predetermined value smaller than the first predetermined value when the detected level is lower than the threshold, and
    the threshold is a threshold voltage at which a control-voltage to amplitude-attenuation characteristic of said tuner means is abruptly changed.

4. The digital broadcast receiving apparatus according to claim 2, wherein
    said gain change means uses, as the gain, a first predetermined value when the detected level is lower than a first threshold, a second predetermined value larger than the first predetermined value when the detected level is higher than a second threshold, and one of the first and second predetermined values based on a value immediately before the detected level when the detected level is higher than the first threshold and lower than the second threshold,
    the first threshold is a voltage lower, by a first predetermined amount, than a threshold voltage at which a control-voltage to amplitude-attenuation characteristic of said tuner means is abruptly changed, and
    the second threshold is a voltage lower, by a second predetermined amount, than the threshold voltage.

5. A digital broadcast receiving apparatus for amplifying a digital modulated signal wave propagated through air with gain automatically adjusted to have a predetermined amplitude, and demodulating the digital modulated signal wave to a digital signal, the digital broadcast receiving apparatus comprising:
    a tuner operable to frequency-convert the digital modulated signal wave into a first modulated signal;
    a first automatic gain controller operable to control gain of said tuner to make a level of the first modulated signal at a first predetermined level;
    an A/D converter operable to convert, analog to digital, the first modulated signal into a second modulated signal;
    a demodulator operable to demodulate the second modulated signal into a first demodulated digital signal; and
    a second automatic gain controller operable to amplify a level of the first demodulated digital signal by following frequency fluctuations thereof to be at a second predetermined level, and generate a second demodulated digital signal, wherein
    said first automatic gain controller controls amplification of the digital modulated signal wave by following frequency fluctuations thereof that are smaller than a first predetermined frequency for generation of the first modulated signal, and said second automatic gain controller amplifies the first demodulated digital signal by following frequency fluctuations thereof under a second predetermined frequency that is larger than the first predetermined frequency, and generates the second demodulated digital signal.

6. The digital broadcast receiving apparatus according to claim 5, wherein the first automatic gain controller comprising:
    a level detector operable to detect a level of the second modulated signal; and
    a signal generator operable to change the gain of said tuner based on the detected level.

7. The digital broadcast receiving apparatus according to claim 6, wherein the first automatic gain controller further comprises:
   a level decision unit operable to compare the detected level to a threshold voltage, as a threshold, at which a control-voltage to amplitude-attenuation characteristic of said tuner is abruptly changed, and control said signal generator to use, as the gain, a first predetermined value when the detected level is higher than the threshold, and a second predetermined value smaller than the first predetermined value when the detected level is lower than the threshold.

8. The digital broadcast receiving apparatus according to claim 6, wherein the first automatic gain controller comprises:
   a level decision unit operable to compare the detected level to a first voltage, as a first threshold, lower, by a first predetermined amount, than a threshold voltage at which a control-voltage to amplitude-attenuation characteristic of said tuner is abruptly changed and a second voltage, as a second threshold, lower, by a second predetermined amount, than the threshold voltage, and control said signal generator to use, as the gain, a first predetermined value when the detected level is lower than the first threshold, a second predetermined value larger than the first predetermined value when the detected level is higher than the second threshold, and one of the first and second predetermined values based on a value immediately before the detected level when the detected level is higher than the first threshold and lower than the second threshold.

9. A digital broadcast receiving apparatus for amplifying a digital modulated signal wave propagated through air with gain automatically adjusted to have a predetermined amplitude, and demodulating the digital modulated signal wave to a digital signal, the digital broadcast receiving apparatus comprising:
   tuner means for frequency-converting the digital modulated signal wave into a first modulated signal;
   first automatic gain control amplification means for controlling gain of said tuner means to make a level of the first modulated signal at a first predetermined level;
   A/D conversion means for converting, analog to digital, the first modulated signal into a second modulated signal;
   demodulation means for demodulating the second modulated signal into a first demodulated digital signal; and
   second automatic gain control amplification means for amplifying a level of the first demodulated digital signal to be at a second predetermined level, and generating a second demodulated digital signal, wherein
   the second automatic gain control amplification means includes:
      multiplication means for receiving the first demodulated digital signal and an automatic gain control signal, multiplying the first demodulated digital signal by the automatic gain control signal, and outputting the multiplied signal as the second demodulated digital signal;
      level detection means for receiving the second demodulated digital signal outputted from the multiplication means, detecting a level of the second demodulated digital signal, and generating a level signal representing the level of the second demodulated digital signal; and
      automatic gain control signal generation means for receiving the level signal representing the level of the second demodulated digital signal, generating the automatic gain control signal based on the received level signal, and outputting the automatic gain control signal to the multiplication means,
   the first automatic gain control amplification means includes:
      level detection means for receiving the second modulated signal outputted from the A/D conversion means, detecting a level of the second modulated signal, and generating a level signal representing the level of the second modulated signal; and
      automatic gain control signal generation means for receiving the level signal representing the level of the second modulated signal, generating an automatic gain control signal based on the received level signal, and outputting the automatic gain control signal to the tuner means,
   the automatic gain control signal generation means in the first automatic gain control amplification means includes multiplication means for multiplying the level signal from the level detection means of the first automatic gain control amplification means by a first constant,
   the automatic gain control signal generation means in the second automatic gain control amplification means includes multiplication means for multiplying the level signal from the level detection means of the second automatic gain control amplification means by a second constant, and
   the second constant is greater than the first constant.

10. A digital broadcast receiving apparatus for amplifying a digital modulated signal wave propagated through air with gain automatically adjusted to have a predetermined amplitude, and demodulating the digital modulated signal wave to a digital signal, the digital broadcast receiving apparatus comprising:
   a tuner operable to frequency-convert the digital modulated signal wave into a first modulated signal;
   a first automatic gain controller operable to control gain of said tuner to make a level of the first modulated signal at a first predetermined level;
   an A/D converter operable to convert, analog to digital, the first modulated signal into a second modulated signal;
   a demodulator operable to demodulate the second modulated signal into a first demodulated digital signal; and
   a second automatic gain controller operable to amplify a level of the first demodulated digital signal to be at a second predetermined level, and generate a second demodulated digital signal, wherein
   the second automatic gain controller includes:
      a multiplier operable to receive the first demodulated digital signal and an automatic gain control signal, multiply the first demodulated digital signal by the automatic gain control signal, and output the multiplied signal as the second demodulated digital signal;
      a level detector operable to receive the second demodulated digital signal outputted from the multiplier, detect a level of the second demodulated digital signal, and generate a level signal representing the level of the second demodulated digital signal; and
      automatic gain control signal generator operable to receive the level signal representing the level of the second demodulated digital signal, generate the automatic gain control signal based on the received level signal, and output the automatic gain control signal to the multiplier, the first automatic gain controller includes:

a level detector operable to receive the second modulated signal outputted from the A/D converter, detect a level of the second modulated signal, and generate a level signal representing the level of the second modulated signal; and an automatic gain control signal generator operable to receive the level signal representing the level of the second modulated signal, generate an automatic gain control signal based on the received level signal, and output the automatic gain control signal to the tuner, the automatic gain control signal generator in the first automatic gain controller includes a multiplier operable to multiply the level signal from the level detector of the first automatic gain controller by a first constant, the automatic gain control signal generator in the second automatic gain controller includes a multiplier operable to multiply the level signal from the level detector of the second automatic gain controller by a second constant, and the second constant is greater than the first constant.

11. The digital broadcast receiving apparatus according to claim 9, wherein said first automatic gain control amplification means controls amplification of the digital modulated signal wave without following frequency fluctuations thereof for generation of the first modulated signal.

12. The digital broadcast receiving apparatus according to claim 10, wherein said first automatic gain controller controls amplification of the digital modulated signal wave without following frequency fluctuations thereof for generation of the first modulated signal.

* * * * *